US011398385B2

(12) United States Patent
Huang et al.

(10) Patent No.: US 11,398,385 B2
(45) Date of Patent: Jul. 26, 2022

(54) SEMICONDUCTOR DEVICE AND METHOD

(71) Applicant: Taiwan Semiconductor Manufacturing Company, Ltd., Hsinchu (TW)

(72) Inventors: Yu-Lien Huang, Jhubei (TW); Guan-Ren Wang, Hsinchu (TW); Ching-Feng Fu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/869,861

(22) Filed: May 8, 2020

(65) Prior Publication Data
US 2021/0351039 A1 Nov. 11, 2021

(51) Int. Cl.
*H01L 21/285* (2006.01)
*H01L 21/02* (2006.01)
*H01L 21/48* (2006.01)

(52) U.S. Cl.
CPC .......... *H01L 21/28556* (2013.01); *H01L 21/02074* (2013.01); *H01L 21/4828* (2013.01)

(58) Field of Classification Search
None
See application file for complete search history.

(56) References Cited

U.S. PATENT DOCUMENTS

| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2016/0163587 | A1 | 6/2016 | Backes et al. |
| 2018/0261543 | A1 | 9/2018 | Clevenger et al. |
| 2019/0259855 | A1 | 8/2019 | Cheng et al. |
| 2020/0035605 | A1 | 1/2020 | Tsai et al. |

(Continued)

FOREIGN PATENT DOCUMENTS

CN          104183609 A     12/2014

*Primary Examiner* — Alexander G Ghyka
(74) *Attorney, Agent, or Firm* — Slater Matsil, LLP

(57) ABSTRACT

An embodiment method includes: forming a gate stack over a channel region; growing a source/drain region adjacent the channel region; depositing a first ILD layer over the source/drain region and the gate stack; forming a source/drain contact through the first ILD layer to physically contact the source/drain region; forming a gate contact through the first ILD layer to physically contact the gate stack; performing an etching process to partially expose a first sidewall and a second sidewall, the first sidewall being at a first interface of the source/drain contact and the first ILD layer, the second sidewall being at a second interface of the gate contact and the first ILD layer; forming a first conductive feature physically contacting the first sidewall and a first top surface of the source/drain contact; and forming a second conductive feature physically contacting the second sidewall and a second top surface of the gate contact.

20 Claims, 20 Drawing Sheets

(56) References Cited

U.S. PATENT DOCUMENTS

| | | |
|---|---|---|
| 2020/0051858 A1 | 2/2020 | Chen et al. |
| 2020/0105586 A1 | 4/2020 | Hsu et al. |
| 2020/0135871 A1 | 4/2020 | Tsai et al. |
| 2020/0194371 A1* | 6/2020 | Clevenger ............. H01L 23/485 |

* cited by examiner

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
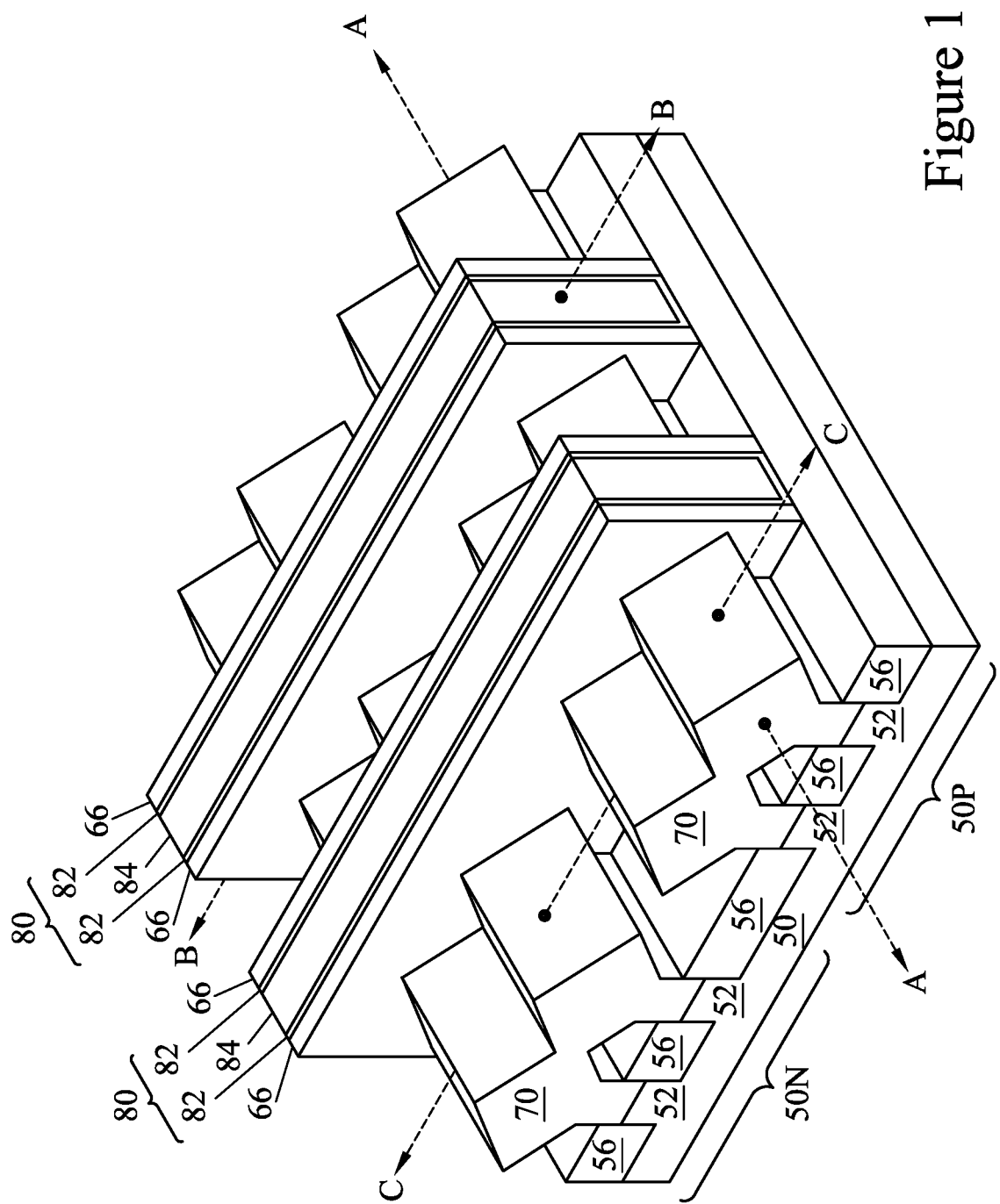
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, gate contacts and/or source/drain contacts are formed having large interfaces with overlying conductive features. Specifically, the interfaces have a larger surface area. The surface area of the interfaces may be increased by exposed sidewalls, convex top surfaces, or concave top surfaces of the contacts during processing. The overlying conductive features are formed to physically contact the exposed surfaces. Such interfaces have a greater surface area than flat interfaces. Optionally, the interfaces can also be doped. Doping the interfaces can reduce the work function difference between the material of the contacts and the material of the overlying conductive features when the contacts and the overlying conductive features are formed of different conductive materials. Increasing the surface area of the interfaces and reducing the work function difference can help reduce the resistance of the contacts, improving the performance of the FinFETs.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refers to the portions extending between the neighboring STI regions 56.

Gate structures 80 are over channel regions of the fins 52. The gate structures 80 include gate dielectrics 82 and gate electrodes 84. The gate dielectrics 82 are along sidewalls and over top surfaces of the fins 52, and the gate electrodes 84 are over the gate dielectrics 82. Source/drain regions 70 are disposed in opposite sides of the fins 52 with respect to the gate dielectrics 82 and gate electrodes 84. Gate spacers 66 separate the source/drain regions 70 from the gate structures 80. In embodiments where multiple transistors are formed, the source/drain regions 70 may be shared between various transistors. In embodiments where one transistor is formed from multiple fins 52, neighboring source/drain regions 70 may be electrically coupled, such as through coalescing the source/drain regions 70 by epitaxial growth, or through coupling the source/drain regions 70 with a same source/drain contact. One or more inter-layer dielectric (ILD) layer(s) (discussed further below) are over the source/drain regions 70 and/or gate electrodes 84, through which contacts (discussed further below) to the source/drain regions 70 and the gate electrodes 84 are formed.

FIG. 1 further illustrates several reference cross-sections. Cross-section A-A is along a longitudinal axis of a fin 52 and in a direction of, for example, a current flow between the source/drain regions 70 of a FinFET. Cross-section B-B is perpendicular to cross-section A-A and is along a longitudinal axis of a gate electrode 84. Cross-section C-C is perpendicular to cross-section A-A and extends through source/drain regions 70 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
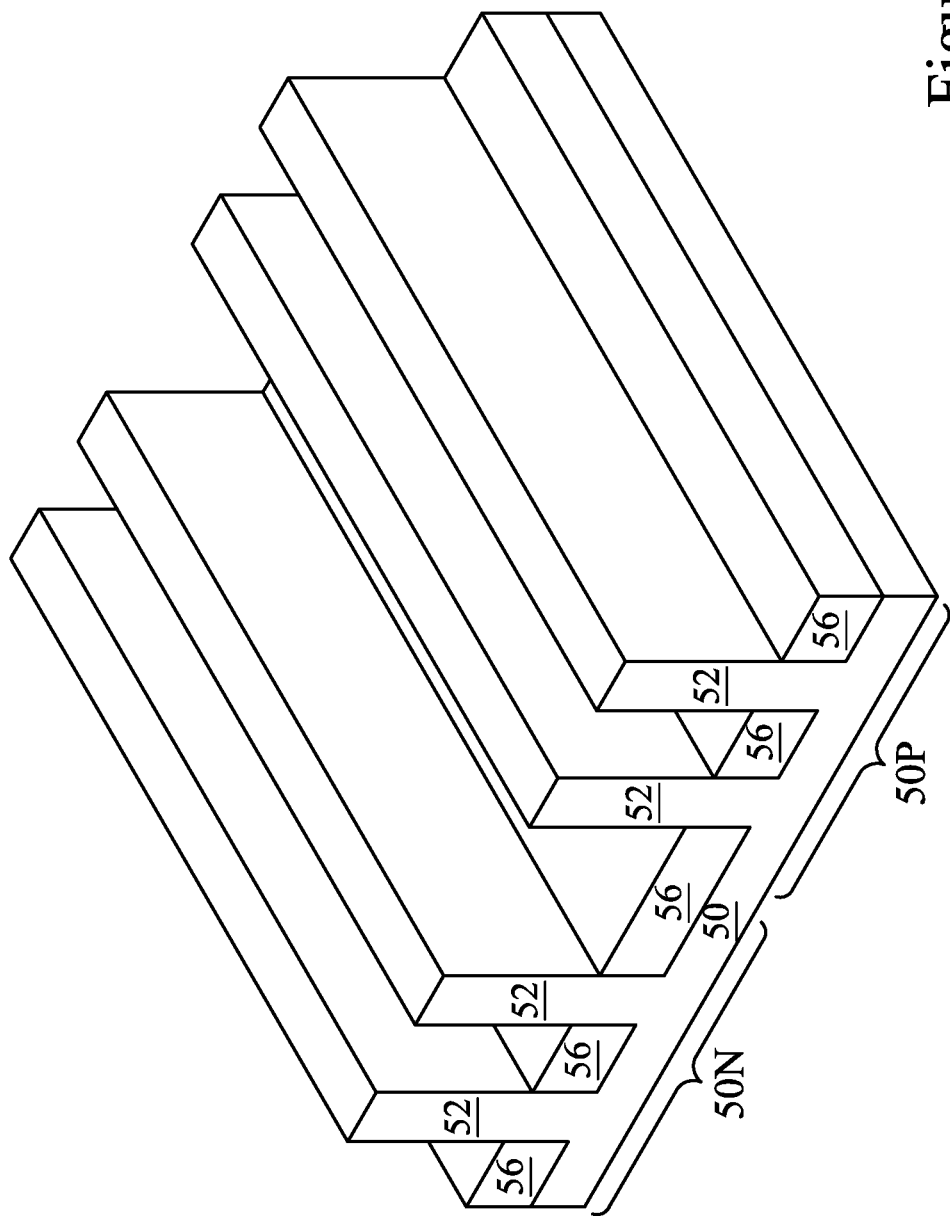
FIGS. 2 and 3 are three-dimensional views of intermediate stages in the manufacturing of FinFETs, in accordance with some embodiments.
Figure 3:
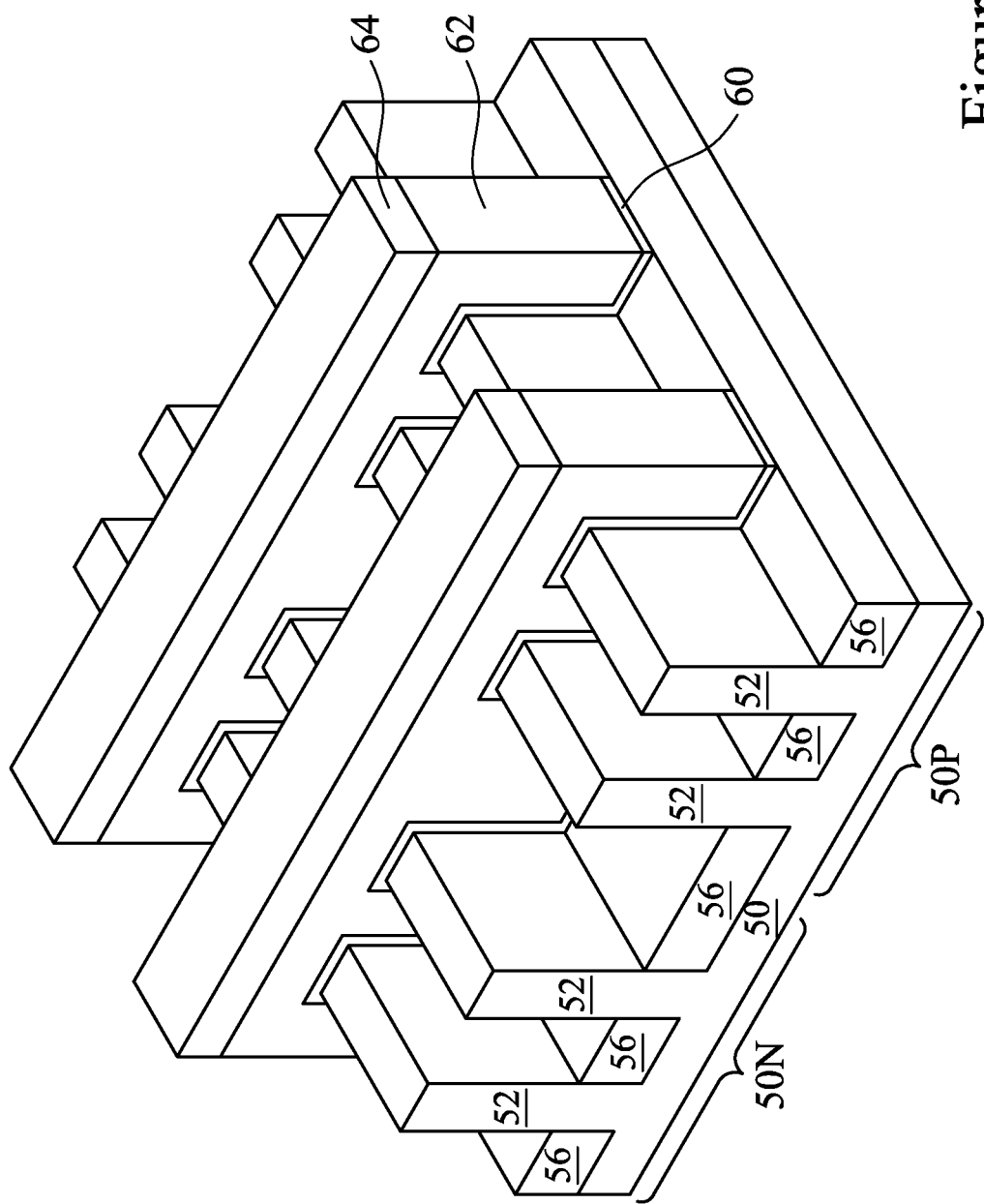

FIGS. 2 and 3 are three-dimensional views of further intermediate stages in the manufacturing of FinFETs, in accordance with some embodiments. FIGS. 2 and 3 show a similar view as FIG. 1, where two gate structures are shown.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE) or the like. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the spacers (or other mask) may remain on the fins 52.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Although the STI regions 56 are illustrated as being single layered, some embodiments may utilize multiple layers. For example, in some embodiments a liner may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are coplanar after the planarization process is complete. In embodiments in which a mask remains on the fins 52, the planarization process may expose the mask or remove the mask such that top surfaces of the mask or the fins 52, respectively, and the insulation material are coplanar after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described above is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 52. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In embodiments with different well types, the different implant steps for the region 50N and the region 50P may be achieved using a photoresist or other masks. For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like, and can be implanted in the region to a concentration of equal to or less than $10^{18}$ $cm^{-3}$, such as in the range of about $10^{16}$ $cm^{-3}$ to about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like, and can be implanted in the region to a concentration of equal to or less than $10^{18}$ $cm^{-3}$, such as in the range of about $10^{16}$ $cm^{-3}$ to about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy dielectrics 60 are formed over the fins 52 and dummy gates 62 are formed over the dummy dielectrics 60. The dummy dielectrics 60 and dummy gates 62 may be collectively referred to as "dummy gate stacks," with each dummy gate stack including a dummy dielectric 60 and a dummy gate 62. The dummy gate stacks extend along sidewalls of the fins 52.

As an example to form the dummy dielectrics 60 and the dummy gates 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing the selected material. The dummy gate layer may be made of other materials that have a high etching selectivity from the etching of the STI regions 56. The mask layer may include, for example, silicon nitride, silicon oxynitride, or the like. In this example, a single dummy gate layer and a single mask layer are formed across the region 50N and the region 50P. The mask layer is then patterned using acceptable photolithography and etching techniques to form masks 64. The pattern of the masks 64 is then transferred to the dummy gate layer by an acceptable etching technique to form the dummy gates 62. The pattern of the masks 64 may optionally be further transferred to the dummy dielectric layer to form the dummy dielectrics 60. The dummy gates 62 cover respective channel regions 58 (see FIGS. 4A and 4B) of the fins 52. The pattern of the masks 64 may be used to physically separate each of the dummy gates 62 from adjacent dummy gates. The dummy gates 62 may also have a lengthwise direction substantially perpendicular (within process limitations) to the lengthwise direction of respective fins 52. Although the dummy dielectrics 60 are shown covering the STI regions 56, it should be appreciated that the dummy dielectrics 60 can be formed in other manners. In some embodiments, such as when the dummy dielectric layer is thermally grown, the dummy dielectrics 60 are formed to only cover the fins 52.

FIGS. 4A through 7B are cross-sectional views of further intermediate stages in the manufacturing of FinFETs, in accordance with some embodiments. FIGS. 4A, 5A, 6A, and 7A are cross-sectional views illustrated along reference cross-section A-A in FIG. 1, where two gate structures are shown. FIGS. 4B, 5B, 6B, and 7B are cross-sectional views illustrated along reference cross-section B-B in FIG. 1, except only two fins are shown. FIGS. 4C and 4D are cross-sectional views illustrated along reference cross-section C-C in FIG. 1, except only two fins are shown. FIGS. 4A through 7B illustrate features in either of the region 50N and the region 50P. For example, the structures illustrated in FIGS. 4A through 7B may be applicable to both the region 50N and the region 50P. Differences (if any) in the structures of the region 50N and the region 50P are described herein.

Figure 4B:
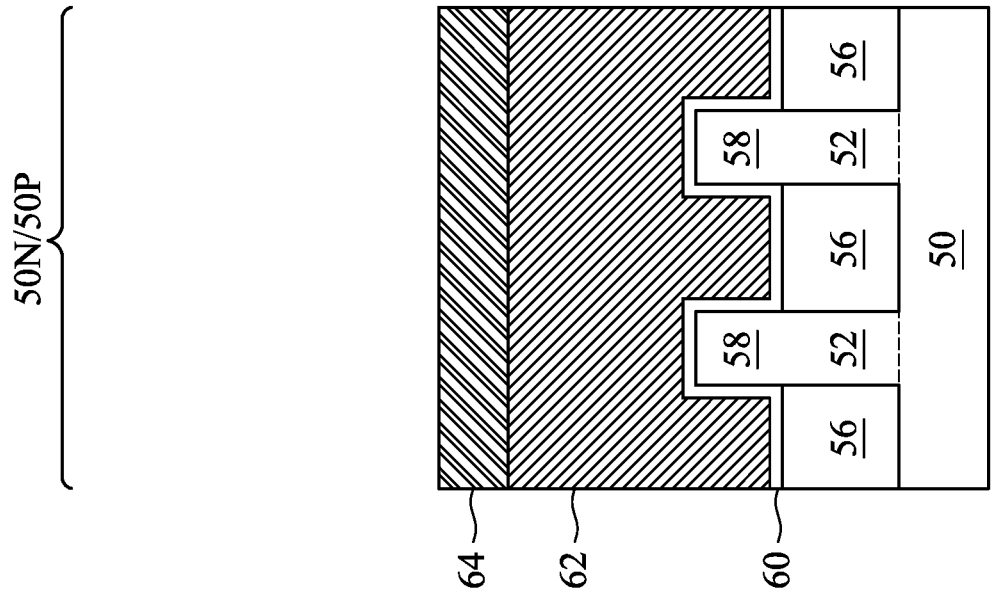
FIGS. 4A, 4B, 4C, 4D, 5A, 5B, 6A, 6B, 7A, and 7B are cross-sectional views of further intermediate stages in the manufacturing of FinFETs, in accordance with some embodiments.
Figure 4A:
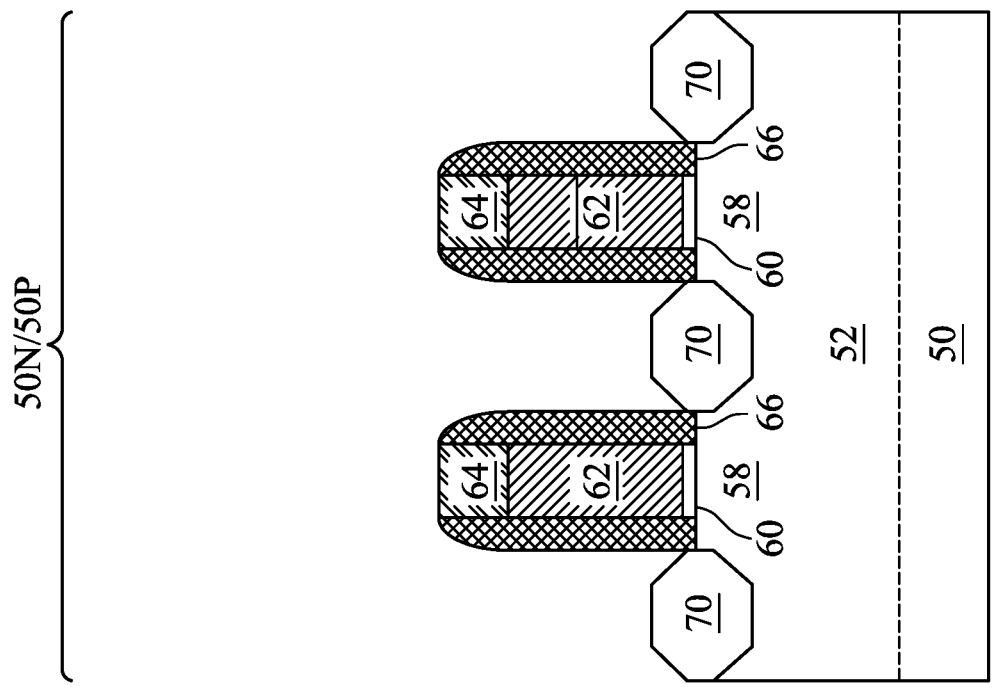

In FIGS. 4A and 4B, gate spacers 66 are formed on exposed surfaces of the dummy gates 62, the masks 64, and/or the fins 52. The gate spacers 66 may be formed by forming an insulating material and subsequently etching the insulating material. The insulating material of the gate spacers 66 may be silicon nitride, silicon carbonitride, silicon oxycarbonitride, a combination thereof, or the like, and may be formed by thermal oxidation, deposition, a combination thereof, or the like. In some embodiments, the gate spacers 66 are formed from a multi-layered insulating material, and include multiple layers. For example, the gate spacers 66 may include multiple layers of silicon carbonitride, may include multiple layers of silicon oxycarbonitride, or may include a layer of silicon oxide disposed between two layers of silicon nitride. The etching of the gate spacers 66 can be anisotropic. After the etching, the gate spacers 66 can have straight sidewalls or curved sidewalls.

Before or during the formation of the gate spacers 66, implants for lightly doped source/drain (LDD) regions (not explicitly illustrated) may be performed. In embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Epitaxial source/drain regions 70 are then formed in the fins 52. The epitaxial source/drain regions 70 are formed in the fins 52 such that each of the dummy gates 62 are disposed between respective neighboring pairs of the epitaxial source/drain regions 70. In some embodiments the epitaxial source/drain regions 70 may extend into portions of the fins 52 beneath the top surfaces of the STI regions 56. In some embodiments, the gate spacers 66 are used to separate the epitaxial source/drain regions 70 from the dummy gates 62 by an appropriate lateral distance so that the epitaxial source/drain regions 70 do not short out subsequently formed gates of the resulting FinFETs. The epitaxial source/drain regions 70 can exert stress in the channel regions 58 of the fins 52, thereby improving performance.

The epitaxial source/drain regions 70 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 70 in the region 50N are epitaxially grown in the recesses. The epitaxial source/drain regions 70 may include any acceptable material, such as appropriate for n-type FinFETs. For example, if the fins 52 are silicon, the epitaxial source/drain regions 70 in the region 50N may include materials exerting a tensile strain in the channel region 58, such as silicon, silicon carbide, phosphorous doped silicon carbide, silicon phosphide, or the like. The epitaxial source/drain regions 70 in the region 50N may have surfaces raised from respective surfaces of the fins 52 and may have facets.

The epitaxial source/drain regions 70 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 70 in the region 50P are epitaxially grown in the recesses. The epitaxial source/drain regions 70 may include any acceptable material, such as appropriate for p-type FinFETs. For example, if the fins 52 are silicon, the epitaxial source/drain regions 70 in the region 50P may comprise materials exerting a compressive strain in the channel region 58, such as silicon-germanium, boron doped silicon-germanium, germanium, germanium tin, or the like. The epitaxial source/drain regions 70 in the region 50P may also have surfaces raised from respective surfaces of the fins 52 and may have facets.

The epitaxial source/drain regions 70 and/or the fins 52 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 70 may be in situ doped during growth.

Figure 4D:
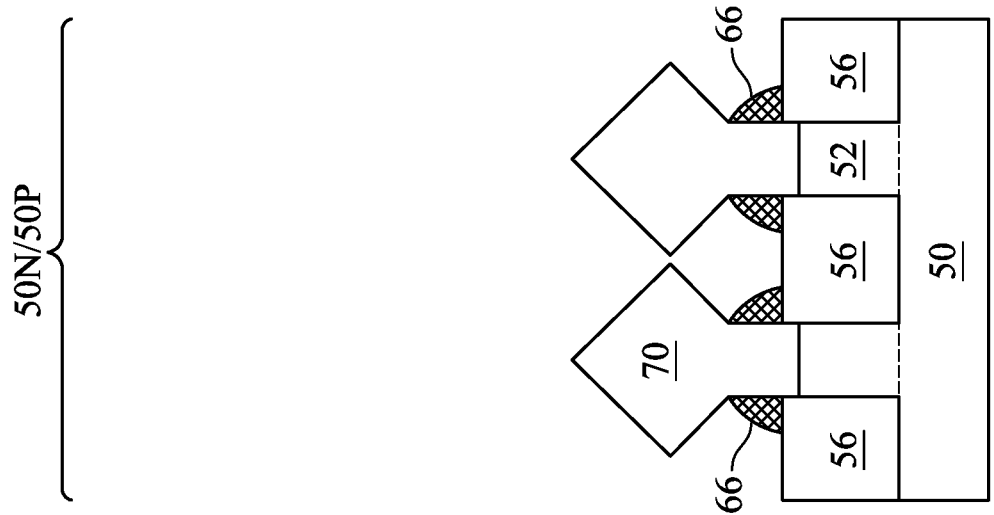
Figure 4C:
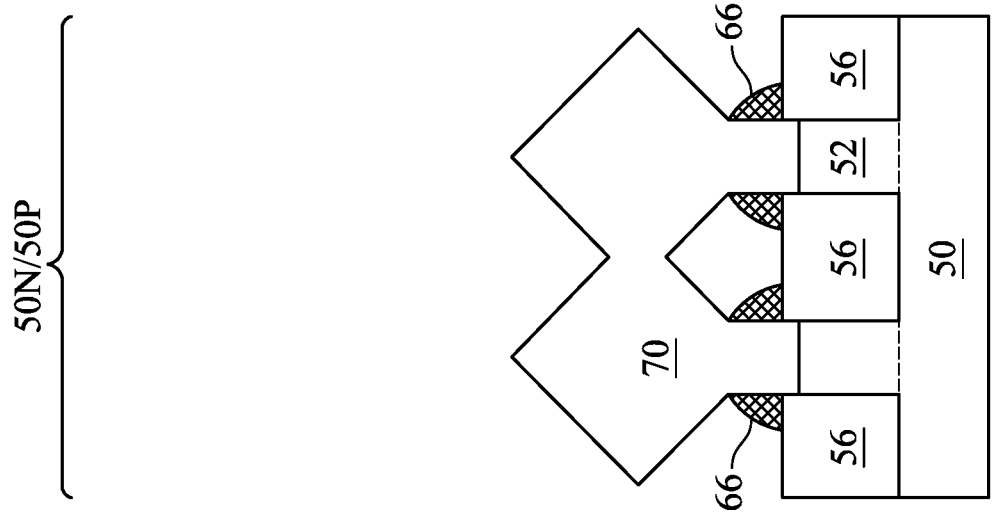

As a result of the epitaxy processes used to form the epitaxial source/drain regions 70, upper surfaces of the epitaxial source/drain regions 70 have facets which expand laterally outward beyond sidewalls of the fins 52. In some embodiments, these facets cause adjacent epitaxial source/drain regions 70 of a same FinFET to merge as illustrated by FIG. 4C. For example, merged epitaxial source/drain regions 70 may be formed when one transistor is formed from multiple fins 52. In other embodiments, adjacent epitaxial source/drain regions 70 remain separated after the epitaxy process is completed as illustrated by FIG. 4D. For example, unmerged epitaxial source/drain regions 70 may be formed when one transistor is formed from a single fin 52 or when one transistor is formed from multiple fins 52. In the embodiments illustrated, the gate spacers 66 are formed covering a portion of the sidewalls of the fins 52 that extend above the STI regions 56, thereby blocking the epitaxial growth. In some other embodiments, the spacer etch used to form the gate spacers 66 may be adjusted to remove the spacer material to allow the epitaxially grown region to extend to the surface of the STI regions 56.

It is noted that the above disclosure generally describes a process of forming spacers, LDD regions, and source/drain regions. Other processes and sequences may be used. For example, fewer or additional spacers may be utilized, different sequence of steps may be utilized, spacers may be formed and removed, and/or the like. In some embodiments, the gate spacers 66 can be formed after the epitaxial source/drain regions 70. Furthermore, the n-type and p-type devices may be formed using a different structures and steps. In some embodiments, dummy spacers can be formed in the region 50N during the formation of the epitaxial source/drain regions 70 in the region 50N. The dummy spacers in the region 50N can then be removed. Dummy spacers can then be formed in the region 50P during the formation of the epitaxial source/drain regions 70 in the region 50P. The dummy spacers in the region 50P can then be removed. The gate spacers 66 can then be formed after the epitaxial source/drain regions 70 have been formed in both the region 50N and the region 50P.

Figures 5A, 5B:
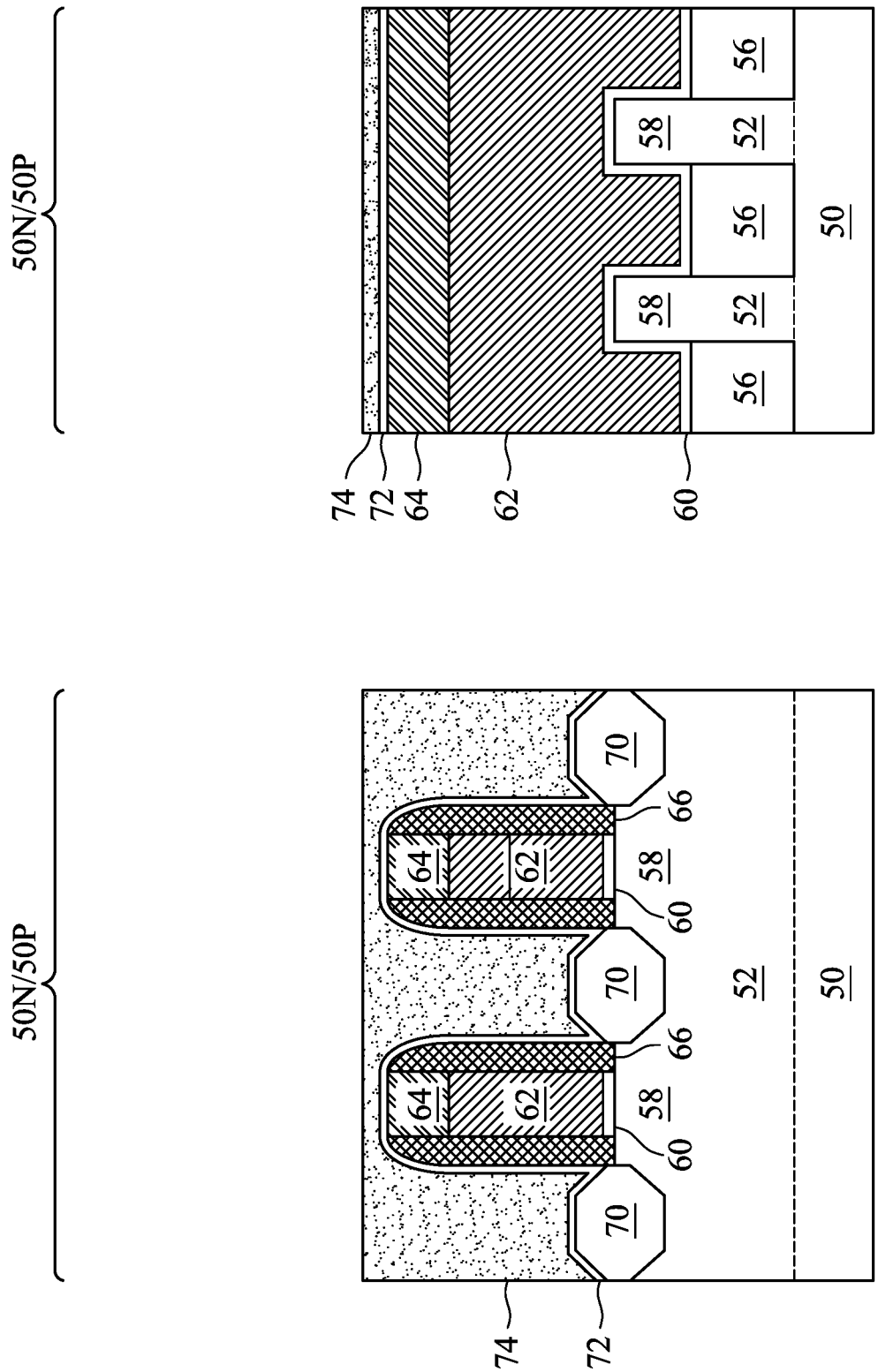

In FIGS. 5A and 5B, a CESL 72 is deposited over the epitaxial source/drain regions 70, the gate spacers 66, the masks 64 (if present) or the dummy gates 62, and the STI regions 56. The CESL 72 is formed of a dielectric material, such as silicon nitride, silicon oxide, silicon oxynitride, or the like. In an embodiment, the CESL 72 is formed of silicon nitride.

A first ILD layer 74 is then deposited over the CESL 72. The first ILD layer 74 is formed of a dielectric material having a different etch rate than the material of the CESL 72, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. After formation, the first ILD layer 74 can be planarized, such as by a CMP.

Figure 6B:
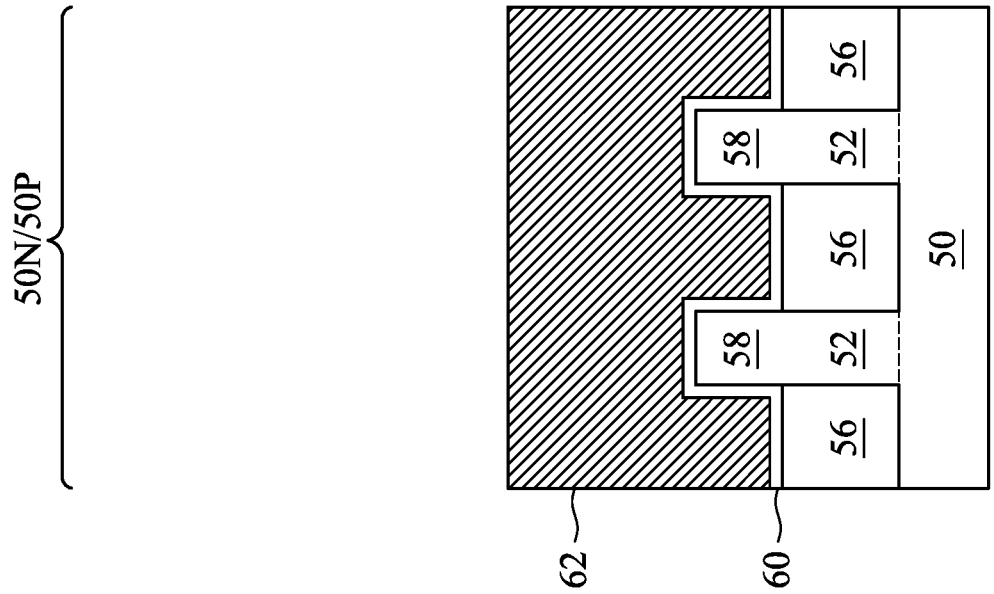
Figure 6A:
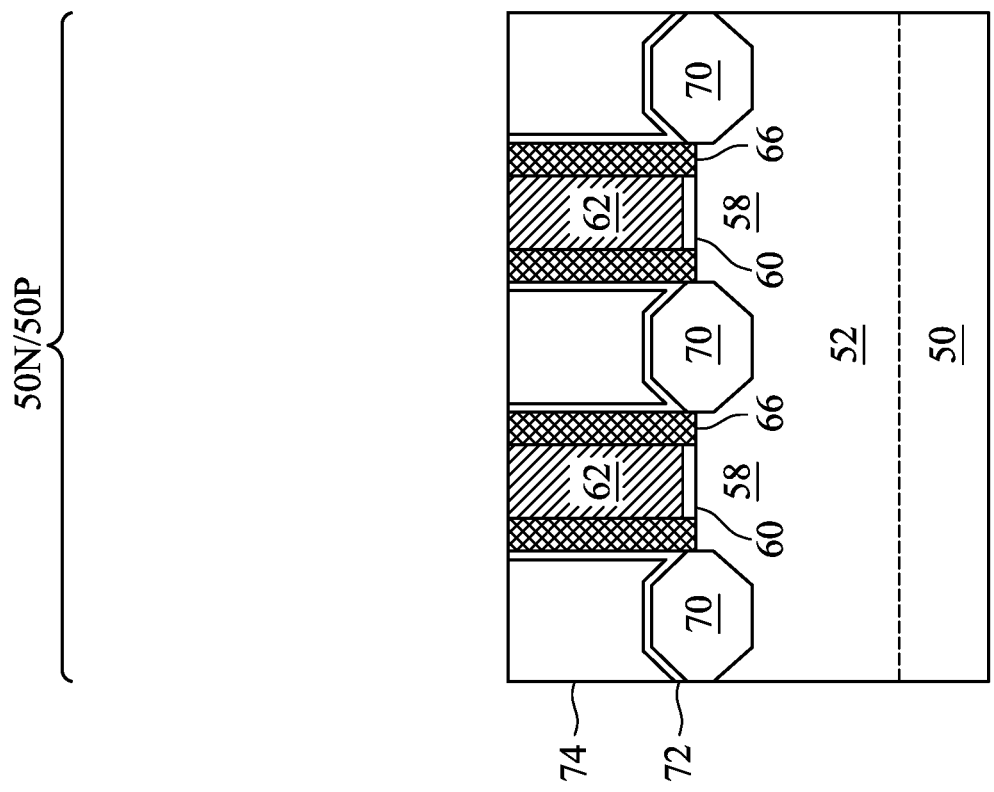

In FIGS. 6A and 6B, a planarization process, such as a CMP, may be performed to level the top surface of the first ILD layer 74 with the top surfaces of the masks 64 (if present) or the dummy gates 62. The planarization process can remove the masks 64 on the dummy gates 62 and portions of the gate spacers 66 along sidewalls of the masks 64. The planarization process can also remove portions of the CESL 72 over the dummy gates 62 and the gate spacers 66. After the planarization process, top surfaces of the dummy gates 62, the gate spacers 66, the CESL 72, and the first ILD layer 74 are coplanar. Accordingly, the top surfaces of the dummy gates 62 are exposed through the first ILD layer 74. In some embodiments, the masks 64 may remain, in which case the planarization process levels the top surface of the first ILD layer 74 with the top surfaces of the masks 64.

Figure 7B:
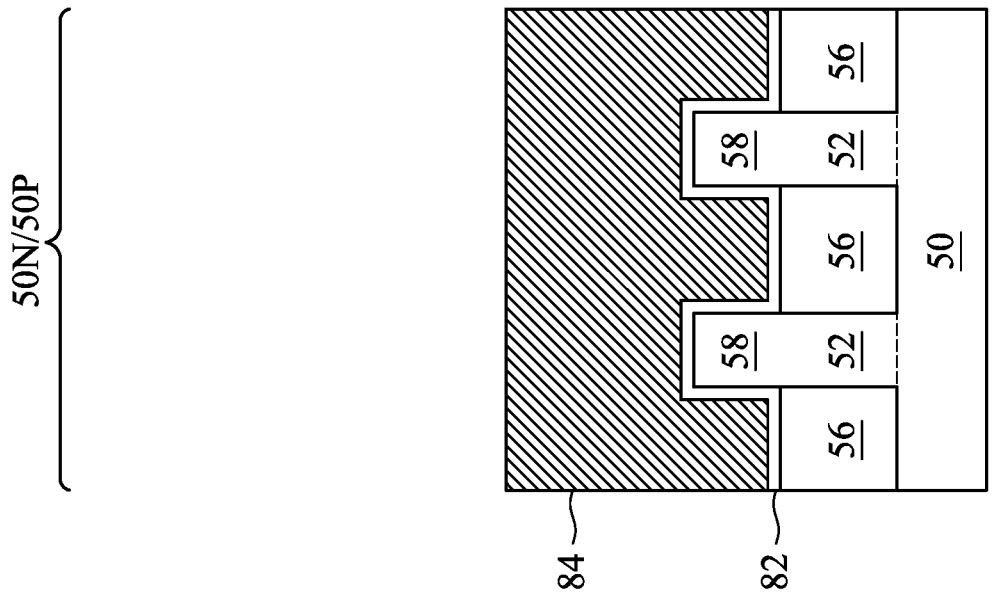
Figure 7A:
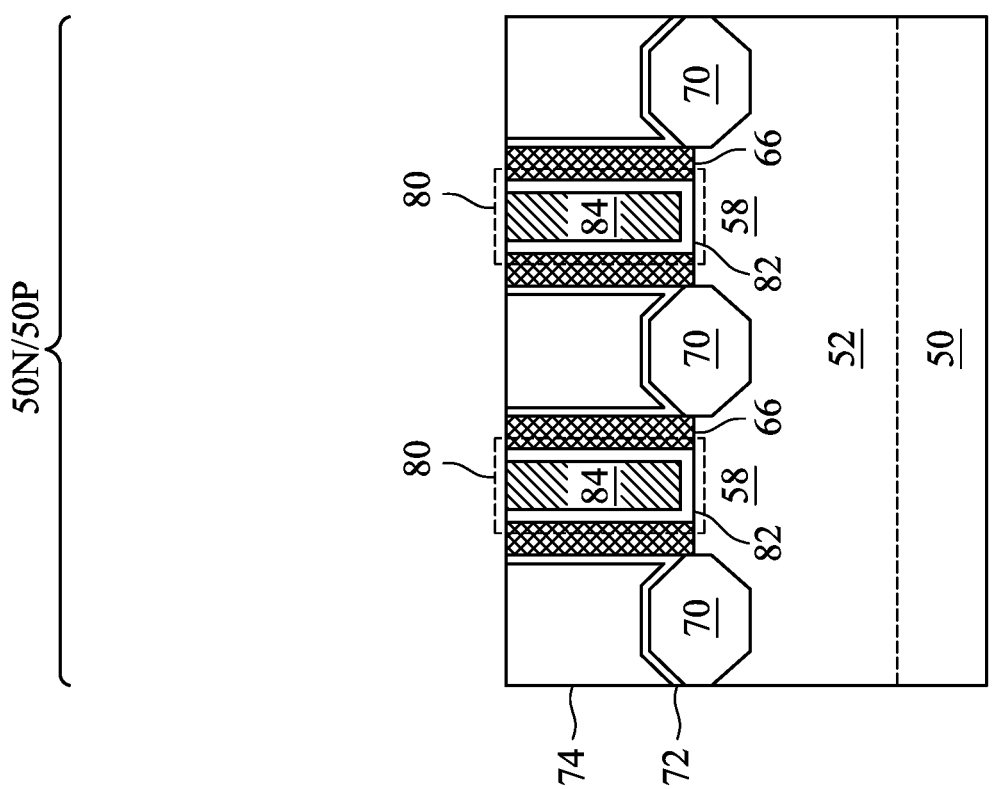

In FIGS. 7A and 7B, the dummy gates 62 and optionally the dummy dielectrics 60 are removed and are replaced with gate structures 80. The gate structures 80 include gate dielectrics 82 and gate electrodes 84. As an example to form the gate structures 80, the dummy gates 62 and the masks 64 (if present) are removed in one or more etching step(s), so that recesses are formed. Portions of the dummy dielectrics 60 in the recesses may also be removed. In some embodiments, only the dummy gates 62 are removed and the dummy dielectrics 60 remain and are exposed by the recesses. In some embodiments, the dummy dielectrics 60 are removed from recesses in a first region of a die (e.g., a core logic region) and remain in recesses in a second region of the die (e.g., an input/output region). In some embodiments, the dummy gates 62 are removed by an anisotropic dry etch process. For example, the etching process may include a dry etch process using reaction gas(es) that selectively etch the dummy gates 62 without etching the first ILD layer 74, the CESL 72, or the gate spacers 66. Each recess exposes and/or overlies a channel region 58 of a respective fin 52. Each channel region 58 is disposed between neighboring pairs of the epitaxial source/drain regions 70. During the removal, the dummy dielectrics 60 may be used as etch stop layers when the dummy gates 62 are etched. The dummy dielectrics 60 may then be optionally removed after the removal of the dummy gates 62. After the removal, the gate dielectrics 82 are deposited conformally in the recesses, such as on the top surfaces and the sidewalls of the fins 52 and on sidewalls of the gate spacers 66. The gate dielectrics 82 may also be formed on top surface of the first ILD layer 74. In accordance with some embodiments, the gate dielectrics 82 comprise silicon oxide, silicon nitride, or multilayers thereof. In some embodiments, the gate dielectrics 82 include a high-k dielectric material, and in these embodiments, the gate dielectrics 82 may have a k value greater than about 7.0, and may include a metal oxide or a silicate of hafnium, aluminum, zirconium, lanthanum, manganese, barium, titanium, lead, and combinations thereof. The formation methods of the gate dielectrics 82 may include molecular-beam deposition (MBD), atomic layer deposition (ALD), PECVD, and the like. In embodiments where portions of the dummy dielectrics 60 remain in the recesses, the gate dielectrics 82 include a material of the dummy dielectrics 60 (e.g., silicon oxide). The gate electrodes 84 are deposited over the gate dielectrics 82, respectively, and fill the remaining portions of the recesses. The gate electrodes 84 may include a metal-containing material such as titanium nitride, titanium oxide, tantalum nitride, tantalum carbide, cobalt, ruthenium, aluminum, tungsten, combinations thereof, or multi-layers thereof. For example, although a single-layer gate electrode 84 is illustrated, each gate electrode 84 may comprise any number of liner layers, any number of work function tuning layers, and a fill material. After the filling of the gate electrodes 84, a planarization process, such as a CMP, may be performed to remove the excess portions of the gate dielectrics 82 and the material of the gate electrodes 84, which excess portions are over the top surface of the first ILD layer 74. The remaining portions of material of the gate electrodes 84 and the gate dielectrics 82 form the gate structures 80 of the resulting FinFETs. The gate structures 80 may be also referred to as "gate stacks" or "metal gates." The gate structures 80 may extend along sidewalls of the channel regions 58 of the fins 52.

The formation of the gate structures 80 in the region 50N and the region 50P may occur simultaneously such that the gate dielectrics 82 in each region are formed from the same materials and the gate electrodes 84 in each region are formed from the same materials. In some embodiments, the gate structures 80 in each region may be formed by distinct processes, such that the gate dielectrics 82 in each region may be different materials and the gate electrodes 84 in each region may be different materials. Various masking steps may be used to mask and expose appropriate regions when using distinct processes.

Figure 8:
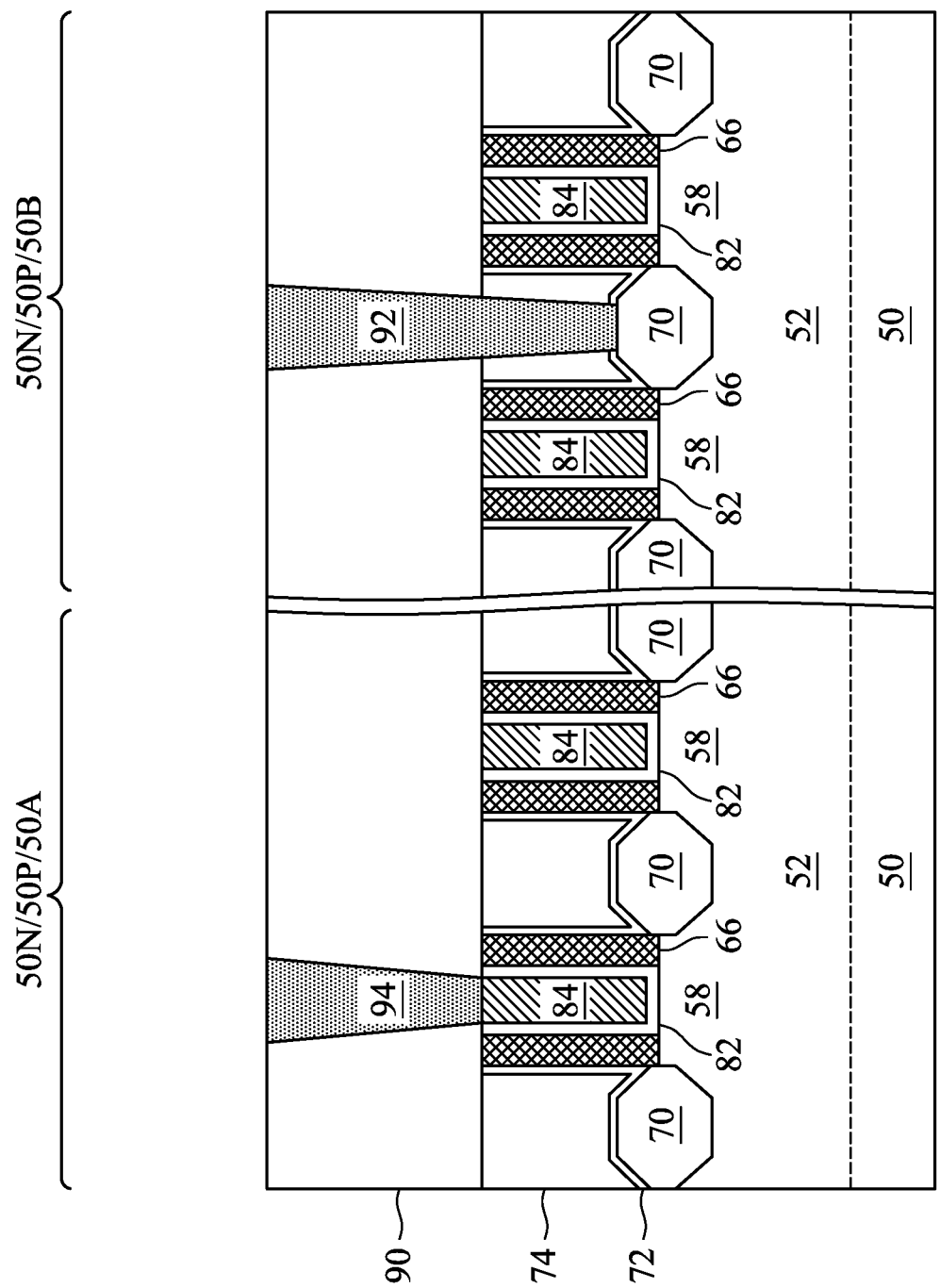
FIGS. 8, 9, and 10 are cross-sectional views of further intermediate stages in the manufacturing of FinFETs, in accordance with some embodiments.
Figure 9:
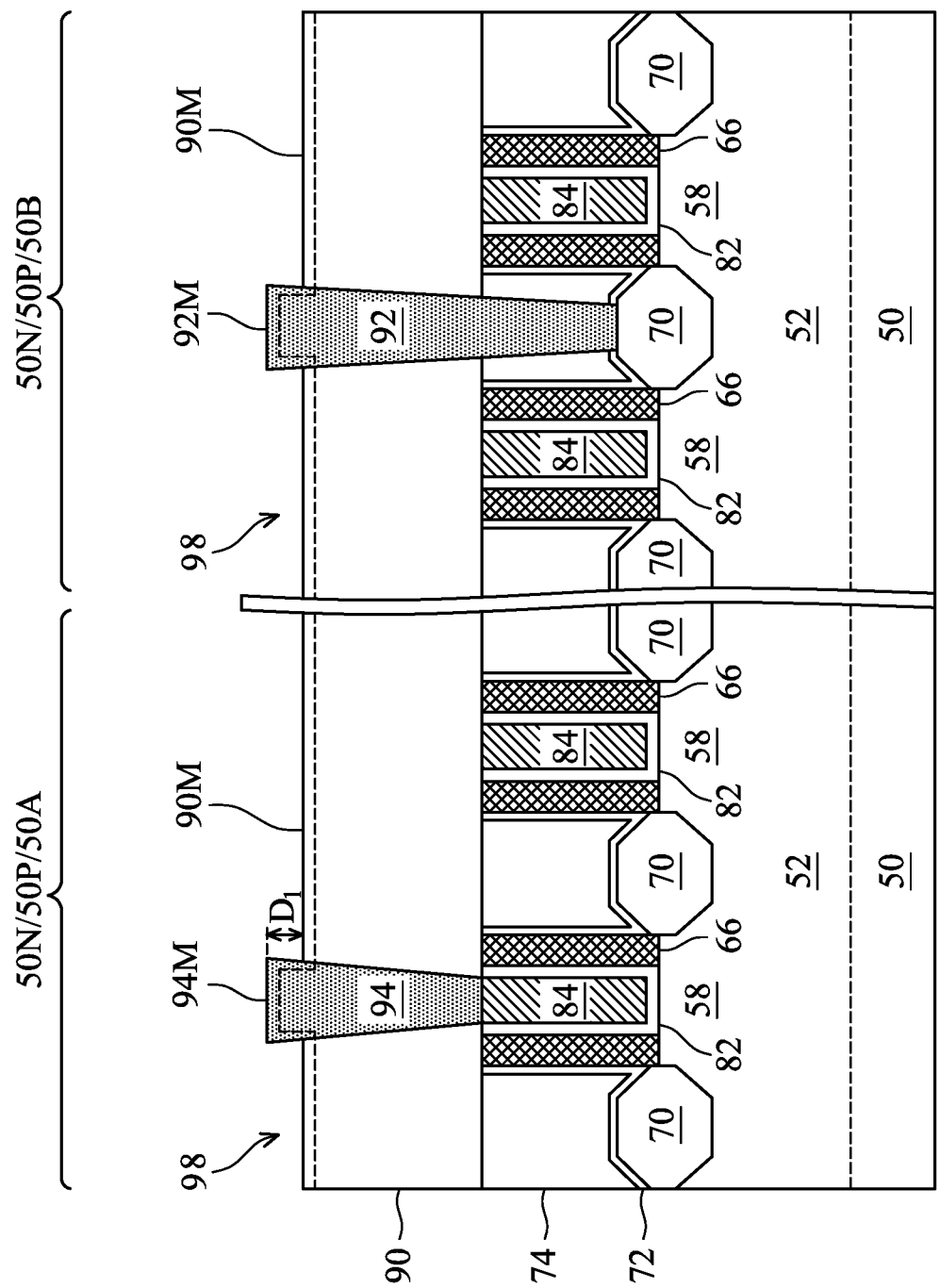
Figure 10:
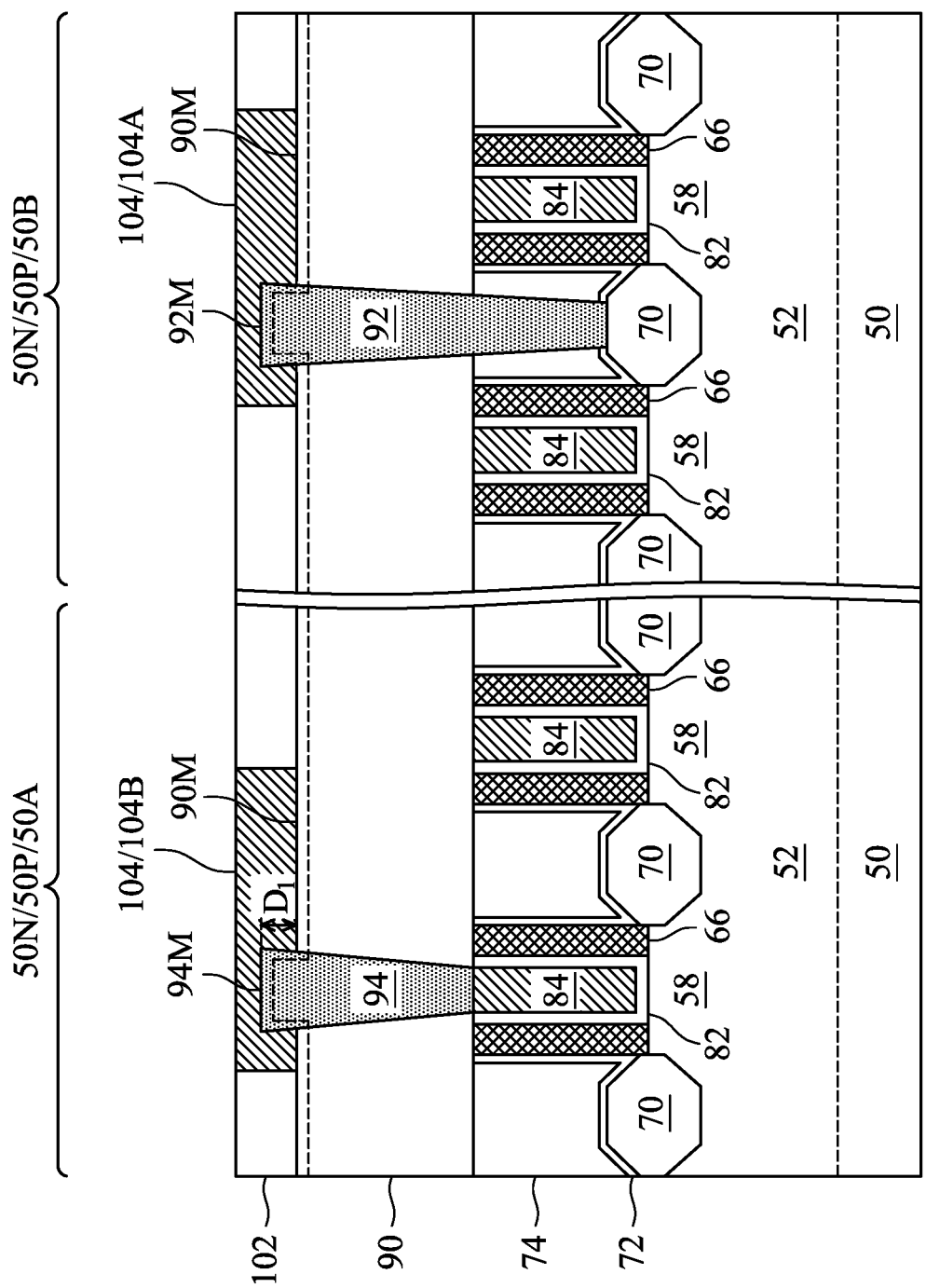

FIGS. 8 through 10 are cross-sectional views of further intermediate stages in the manufacturing of FinFETs, in accordance with some embodiments. FIGS. 8 through 10 are cross-sectional views illustrated along reference cross-section A-A in FIG. 1, except four gate structures are shown. FIGS. 8 through 10 illustrate a first region 50A (in which a gate contact will be formed) and a second region 50B (in which a source/drain contact will be formed). The regions 50A and 50B are processed simultaneously and are discussed together. The regions 50A and 50B are parts of different cross-sections in which the contacts are formed, which may avoid shorting of the contacts. It should be appreciated that a gate contact and a source/drain contact can be formed in the same cross-section for a transistor. One fin 52 is illustrated in each of the regions 50A and 50B, but it should be appreciated that each of the regions 50A and 50B can include fins 52 from both of the regions 50N and 50P of the substrate 50, e.g., the first region 50A and the second region 50B can each include n-type devices and p-type devices.

In FIG. 8, a second ILD layer 90 is deposited over the first ILD layer 74. The second ILD layer 90 is formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. After formation, the second ILD layer 90 can be planarized, such as by a CMP. In some embodiments, an etch stop layer is formed between the first ILD layer 74 and the second ILD layer 90. The etch stop layer may comprise a dielectric material, such as silicon nitride, silicon oxide, silicon oxynitride, or the like, having a different etch rate than the material of the second ILD layer 90. In some embodiments, before the formation of the second ILD layer 90, gate masks (not shown) can be formed over the gate dielectrics 82 and gate electrodes 84, which may protect the gate dielectrics 82 and gate electrodes 84 during contact formation.

After forming the second ILD layer 90, source/drain contacts 92 and gate contacts 94 are formed extending through the second ILD layer 90. Openings for the source/drain contacts 92 are formed through the ILD layers 74, 90, and openings for the gate contacts 94 are formed through the second ILD layer 90. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 90. The remaining liner and conductive material form the source/drain contacts 92 and the gate contacts 94 in the openings. In some embodiments, the source/drain contacts 92 and the gate contacts 94 are formed of the same conductive material. The source/drain contacts 92 are connected (e.g., physically and electrically coupled) to the epitaxial source/drain regions 70, and the gate contacts 94 are connected to the gate electrodes 84. The gate contacts 94 can penetrate through gate masks (if present) over the gate electrodes 84. The source/drain contacts 92 and the gate contacts 94 may be formed in different processes, or may be formed in the same process.

In FIG. 9, the second ILD layer 90 is recessed to form recesses 98. The recesses 98 expose portions of surfaces at the interface of the second ILD layer 90 and the contacts 92, 94, such as portions of the sidewalls of the contacts 92, 94.

In this embodiment, the exposed portions of the contacts 92, 94 have substantially vertical sidewalls and substantially flat top surfaces. In other words, the sidewalls can be substantially perpendicular to the major surface of the substrate 50, and the top surfaces can be substantially parallel to the major surface of the substrate 50. The recessing may be by an acceptable etch process, such as one that is selective to the material of the second ILD layer 90. In embodiments where the second ILD layer 90 is an oxide, a chemical oxide removal may be performed. For example, the second ILD layer 90 can be etched by a wet or dry etch using a mixture of HF and $NH_3$, a mixture of $NF_3$ and $NH_3$, dHF acid, or the like, without plasma, for a duration in the range of about 7 seconds to about 60 seconds, which can form the recesses 98 to a depth $D_1$ of at least about 2 nm, such as in the range of about 2 nm to about 15 nm. The depth $D_1$ can be from about 4% to about 25% of the original height of the second ILD layer 90. Such an etch process can result in a high etch selectivity between the dielectric material of the second ILD layer 90 and the conductive material of the contacts 92, 94. For example, such an etch process can selectively etch the dielectric material of the second ILD layer 90 up to about 15 times faster than the conductive material of the contacts 92, 94. Recessing the second ILD layer 90 with a highly selective etch process can result in the exposed portions of the contacts 92, 94 having substantially vertical sidewalls and substantially flat top surfaces. Recessing the second ILD layer 90 increases the exposed surface area of the contacts 92, 94 by an amount in the range of about 100% to about 700%.

Optionally, one or more implants can be performed to modify the exposed surfaces of the second ILD layer 90, the source/drain contacts 92, and the gate contacts 94. As a result, a doped region 90M of the second ILD layer 90 is formed, doped regions 92M of the source/drain contacts 92 are formed, and doped regions 94M of the gate contacts 94 are formed. The remaining undoped regions of the features subject to implants can be referred to as "main regions." For example, the second ILD layer 90, the source/drain contacts 92, and the gate contacts 94 may be implanted with one or more impurities such as boron, phosphorus, or the like. The doped regions 92M of the source/drain contacts 92 may be implanted to have an impurity concentration of in the range of about $10^{18}$ $cm^{-3}$ to about $10^{21}$ $cm^{-3}$, and the doped regions 94M of the gate contacts 94 may be implanted to have an impurity concentration of in the range of about $10^{18}$ $cm^{-3}$ to about $10^{21}$ $cm^{-3}$. The implanting may be performed at a low energy, such as an energy in the range of about 0.5 keV to about 3 keV so that the impurities do not pass through the second ILD layer 90 and implant in underlying features. Implanting the second ILD layer 90 with an impurity may increase the volume of the second ILD layer 90, thus causing it to expand. The second ILD layer 90 may thus have a decreased density after the implanting. In some embodiments, the second ILD layer 90 has a lesser density than the first ILD layer 74 after the implanting. As discussed further below, subsequently formed interconnects can be formed of a different conductive material than the contacts 92, 94. Forming the doped regions 92M, 94M can help reduce the work function difference between the contacts 92, 94 and the subsequently formed interconnects.

An anneal can be performed after the implanting. For example, the anneal can be performed at a temperature in the range of about 700° C. to about 1200° C. The annealing activates the impurities that were implanted in the second ILD layer 90, the source/drain contacts 92, and the gate contacts 94.

In FIG. 10, an inter-metal dielectric (IMD) layer 102 is formed in the recesses 98 and on the exposed surfaces of the source/drain contacts 92 and the gate contacts 94. Conductive features 104 are formed in the IMD layer 102, and are connected to the source/drain contacts 92 and the gate contacts 94. A first subset of the conductive features 104A are connected to the source/drain contacts 92 and a second subset of the conductive features 104B are connected to the gate contacts 94. The IMD layer 102 and conductive features 104 can be part of an interconnect structure. For example the conductive features 104 can include conductive vias and conductive lines that are part of metallization patterns (e.g., interconnects) of the interconnect structure. The metallization patterns interconnect the resulting FinFETs to form integrated circuits. The interconnect structure (comprising the IMD layer 102 and the conductive features 104) can be formed by a damascene process, such as a single damascene process, a dual damascene process, or the like.

The IMD layer 102 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The IMD layer 102 may be formed by any acceptable deposition process, such as spin coating, physical vapor deposition (PVD), chemical vapor deposition (CVD), the like, or a combination thereof. The IMD layer 102 may be a layer formed of a low-k dielectric material having a k-value lower than about 3.9. The IMD layer 102 may be a layer formed of an extra-low-k (ELK) dielectric material having a k-value of less than 2.5. In some embodiments, an etch stop layer is formed between the IMD layer 102 and the second ILD layer 90. The etch stop layer may comprise a dielectric material, such as silicon nitride, silicon oxide, silicon oxynitride, or the like, having a different etch rate than the material of the IMD layer 102.

The conductive features 104 can include diffusion barrier layers and conductive material over the diffusion barrier layers. As an example to form the conductive features 104, openings are formed in the IMD layer 102 expose underlying conductive features, such as the source/drain contacts 92 and the gate contacts 94. The openings may be formed using acceptable photolithography and etching techniques. The diffusion barrier layers may be formed of titanium, titanium nitride, tantalum, tantalum nitride, or the like, and may be formed in the openings by a deposition process such as atomic layer deposition (ALD) or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 102. After formation of the diffusion barrier layers and the conductive material, excess of the diffusion barrier layers and conductive material may be removed by, for example, a planarization process such as a chemical mechanical polish (CMP) process. The remaining portions of the diffusion barrier layers and conductive material form the conductive features 104.

The conductive features 104 contact the exposed surfaces of the contacts 92, 94 that extend above the second ILD layer 90. In other words, the conductive features 104A contact the top surfaces and sidewalls of the source/drain contacts 92, and the conductive features 104B contact the top surfaces and sidewalls of the gate contacts 94. As a result of recessing the second ILD layer 90, the contacts 92, 94 extend through the second ILD layer 90, and extend partially into the conductive features 104 by the distance $D_1$. The source/drain contacts 92 also extend through the first ILD layer 74. The conductive features 104 thus each physically contact multiple surfaces of one of the contacts 92, 94. The surface area of the interfaces between the contacts 92, 94 and the conductive features 104 may thus be increased. For example, the surface area of each interface may be increased by an amount in the range of about 100% to about 700%. Increasing the surface area of the interfaces between the contacts 92, 94 and the conductive features 104 can help reduce the resistance of the contacts. Because the contacts 92, 94 extend through the second ILD layer 90 and partially into the conductive features 104, the final height of the contacts 92, 94 is greater than the final height of the second ILD layer 90. Specifically, the top surface of the second ILD layer 90 is disposed closer to the substrate 50 than the top surfaces of the contacts 92, 94.

The conductive features 104A are in direct physical contact with the doped regions 92M of the source/drain contacts 92, and the conductive features 104B are in direct physical contact with the doped regions 94M of the gate contacts 94. In some embodiments, the conductive features 104 comprise a different conductive material than the contacts 92, 94. For example, the contacts 92, 94 can be formed of cobalt and the conductive features 104 can be formed of tungsten. Notably, the conductive material of the contacts 92, 94 (e.g., cobalt) can have a different (e.g., greater) work function than the conductive material of the conductive features 104 (e.g., tungsten). In accordance with some embodiments, the doped regions 92M help reduce the work function difference between the source/drain contacts 92 and the conductive features 104A. Likewise, the doped regions 94M help reduce the work function difference between the gate contacts 94 and the conductive features 104B. Specifically, the work function of the material of the doped regions 92M, 94M is less than the work function of the material of the contacts 92, 94 and is greater than the work function of the material of the conductive features 104. Reducing the work function difference between the contacts 92, 94 and the conductive features 104 can help reduce the resistance of the contacts.

Figure 11:
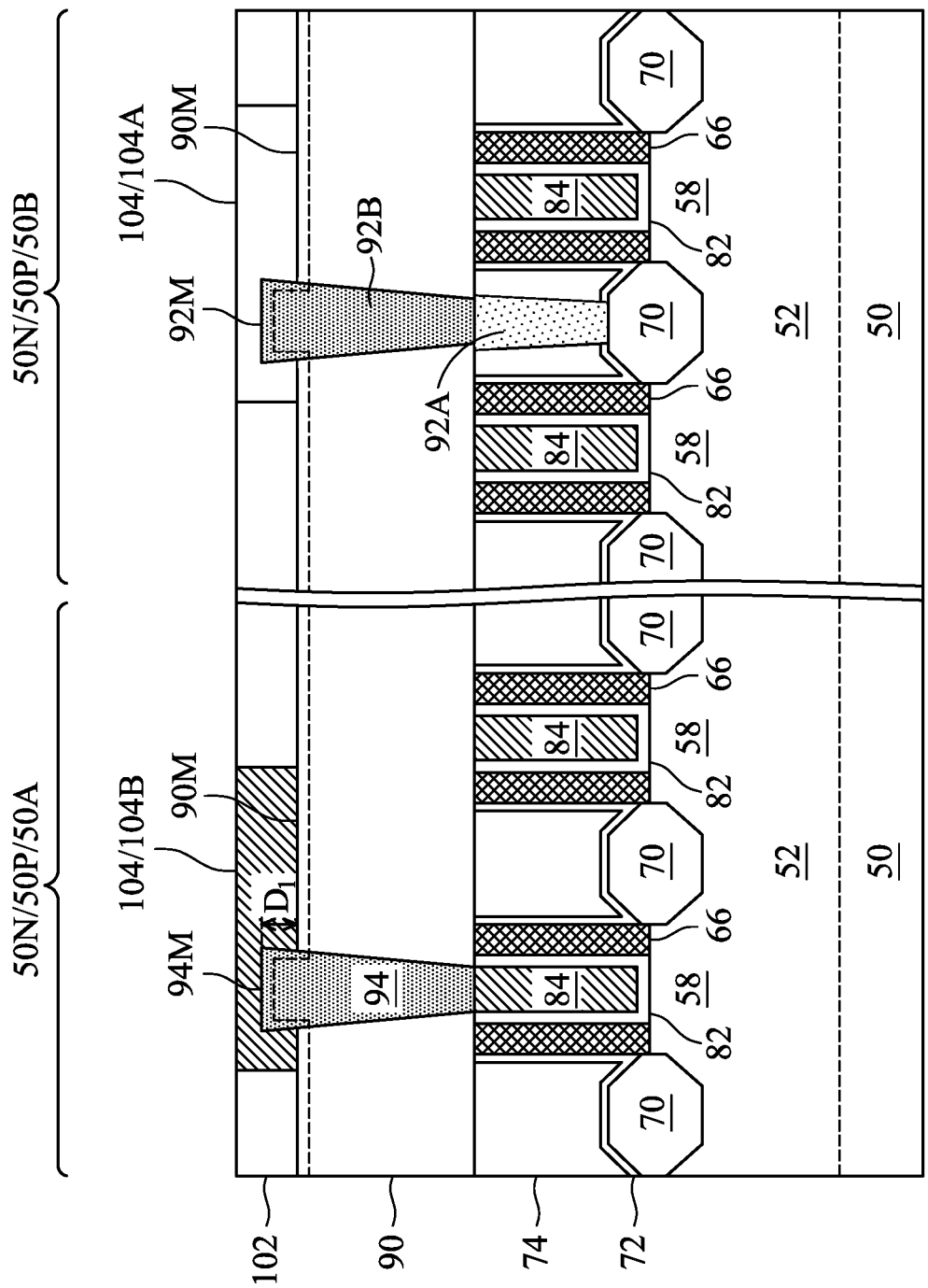
FIG. 11 is a cross-sectional view of FinFETs, in accordance with some other embodiments.

FIG. 11 is a cross-sectional view of FinFETs, in accordance with some other embodiments. This embodiment is similar to the embodiment described with respect to FIG. 10, except the source/drain contacts include lower source/drain contacts 92A and upper source/drain contacts 92B. The lower source/drain contacts 92A extend through the first ILD layer 74 and CESL 72, and the upper source/drain contacts 92B extend through the second ILD layer 90. The recesses 98 (see FIG. 9) thus expose portions of the sidewalls of the contacts 92B, 94. The lower source/drain contacts 92A are thus disposed between the upper source/drain contacts 92B and the epitaxial source/drain regions 70.

As an example to form the lower source/drain contacts 92A, before forming the second ILD layer 90, openings for the lower source/drain contacts 92A can be formed through the first ILD layer 74 and CESL 72. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD layer 74. The remaining liner and conductive material form the lower source/drain contacts 92A in the openings. An anneal process may be performed to form a silicide at the interface between the epitaxial source/drain regions 70 and the lower source/drain contacts 92A. The lower source/drain contacts 92A are connected to the epitaxial source/drain regions 70. After formation, the top surfaces of the gate spacers 66, the first ILD layer 74, the gate electrodes 84, and the lower source/drain contacts 92A are coplanar.

As an example to form the upper source/drain contacts 92B, after forming the second ILD layer 90, openings for the upper source/drain contacts 92B are formed through the second ILD layer 90. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 90. The remaining liner and conductive material form the upper source/drain contacts 92B in the openings. The upper source/drain contacts 92B are connected to the lower source/drain contacts 92A, and the lower source/drain contacts 92A are connected to the epitaxial source/drain regions 70. The upper source/drain contacts 92B and the gate contacts 94 may be formed in different processes, or may be formed in the same process. After formation, the top surfaces of the second ILD layer 90, the upper source/drain contacts 92B, and the gate contacts 94 are coplanar.

It should be appreciated that some embodiments may combine features from the embodiments illustrated in FIGS. 10 and 11. For example, source/drain contacts in a first region of a die (e.g., an input/output region) can be continuous conductive features that extend through multiple ILD layers (as shown in FIG. 10), while source/drain contacts in a second region of the die (e.g., a core logic region) can have separate upper and lower conductive features in respective ILD layers (as shown in FIG. 11).

Figure 12:
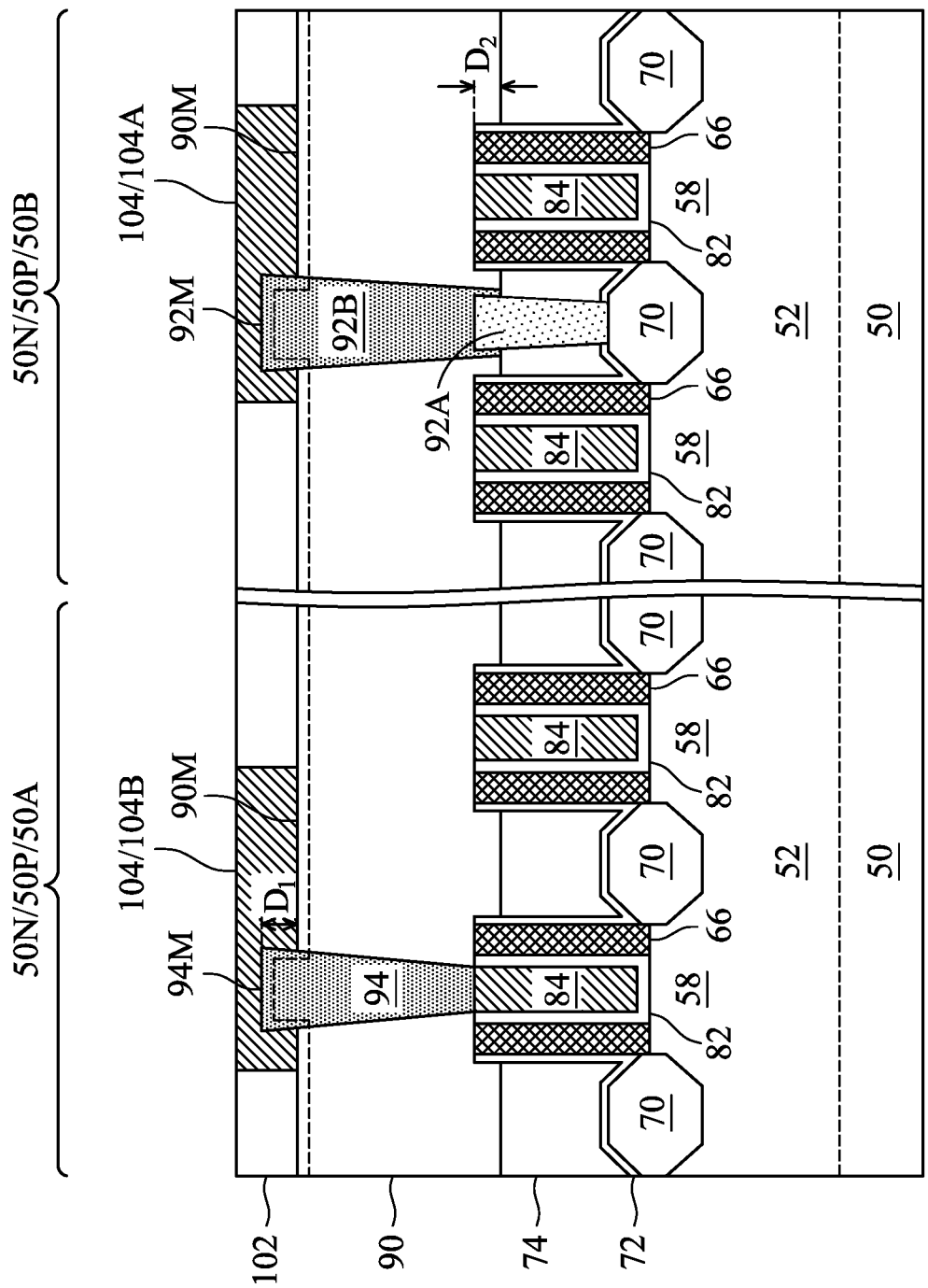
FIG. 12 is a cross-sectional view of FinFETs, in accordance with some other embodiments.

FIG. 12 is a cross-sectional view of FinFETs, in accordance with some other embodiments. This embodiment is similar to the embodiment described with respect to FIG. 11, except the upper source/drain contacts 92B contact the top surfaces and sidewalls of the lower source/drain contacts 92A. The lower source/drain contacts 92A thus extend partially into the upper source/drain contacts 92B. The upper source/drain contacts 92B can be formed in such a manner by recessing the first ILD layer 74 before forming the second ILD layer 90, thus exposing the sidewalls of the lower source/drain contacts 92A. As an example to expose the sidewalls of the lower source/drain contacts 92A, the first ILD layer 74 can be recessed using a similar process as the process for recessing the second ILD layer 90 described with respect to FIG. 9 (e.g., by performing an etch process with a high etch selectivity between the dielectric material of the first ILD layer 74 and the conductive material of the lower source/drain contacts 92A), which can recess the first ILD layer 74 by a depth $D_2$ of at least about 2 nm, such as in the range of about 2 nm to about 15 nm. The depth $D_2$ can be from about 4% to about 25% of the original height of the first ILD layer 74. After the recessing the second ILD layer 90 can be formed contacting a sidewall of the CESL 72. The upper source/drain contacts 92B can then be formed through the second ILD layer 90 to contact the top surfaces and sidewalls of the lower source/drain contacts 92A.

Figure 13:
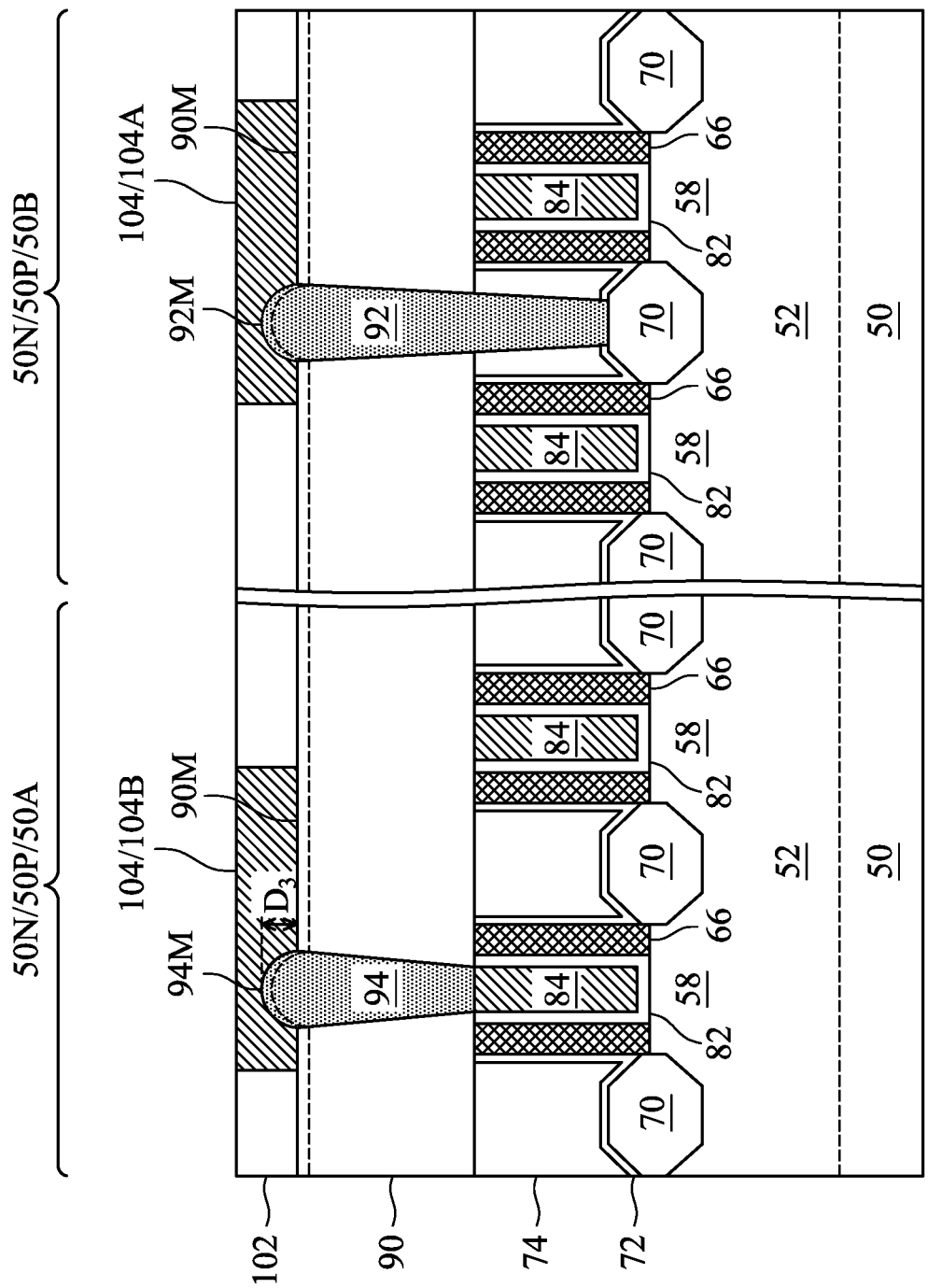
FIG. 13 is a cross-sectional view of FinFETs, in accordance with some other embodiments.

FIG. 13 is a cross-sectional view of FinFETs, in accordance with some other embodiments. This embodiment is similar to the embodiment described with respect to FIG. 10, except the contacts 92, 94 and their associated doped regions 92M, 94M have convex top surfaces and lack clearly defined vertical sidewalls. As an example to form the contacts 92, 94 with convex top surfaces, the second ILD layer 90 can be etched by a wet or dry etch using a mixture of HF and $NH_3$, a mixture of $NF_3$ and $NH_3$, dHF acid, or the like, without plasma, for a duration in the range of about 7 seconds to about 60 seconds, which can recess the second ILD layer 90 to a depth $D_3$ of at least about 2 nm, such as in the range of about 2 nm to about 15 nm. The depth $D_3$ can be from about 4% to about 25% of the original height of the second ILD layer 90. Such an etch process can result in a lower etch selectivity between the dielectric material of the second ILD layer 90 and the conductive material of the contacts 92, 94 than the etch process described with respect to FIG. 9. For example, such an etch process can selectively etch the dielectric material of the second ILD layer 90 up to about 10 times faster than the conductive material of the contacts 92, 94. Recessing the second ILD layer 90 with a less selective etch process can result in the exposed portions of the contacts 92, 94 having convex top surfaces.

Figure 14:
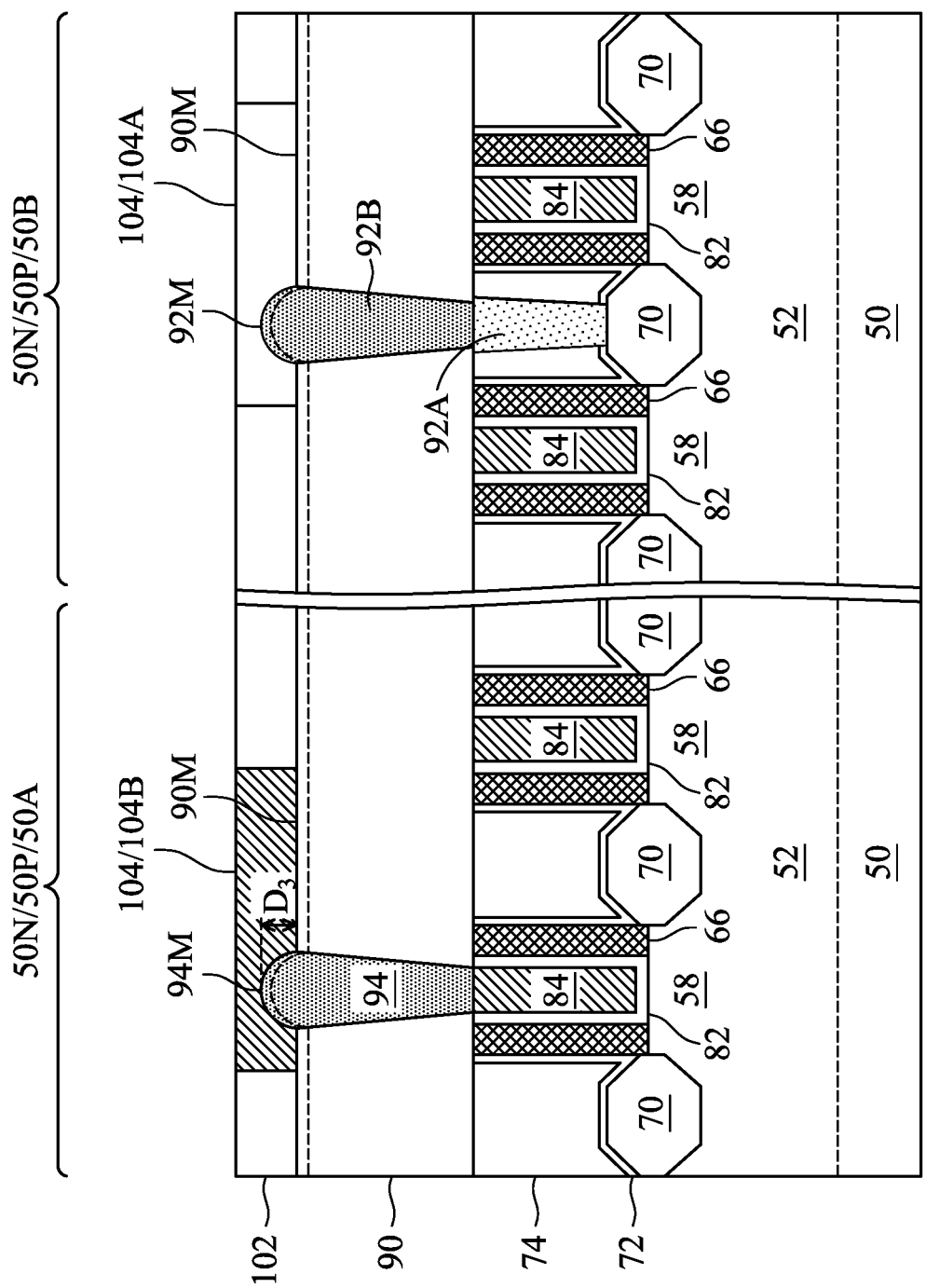
FIG. 14 is a cross-sectional view of FinFETs, in accordance with some other embodiments.

FIG. 14 is a cross-sectional view of FinFETs, in accordance with some other embodiments. This embodiment is similar to the embodiment described with respect to FIG. 13, except the source/drain contacts include lower source/drain contacts 92A and upper source/drain contacts 92B, similar to the embodiment described with respect to FIG. 11.

Figure 15:
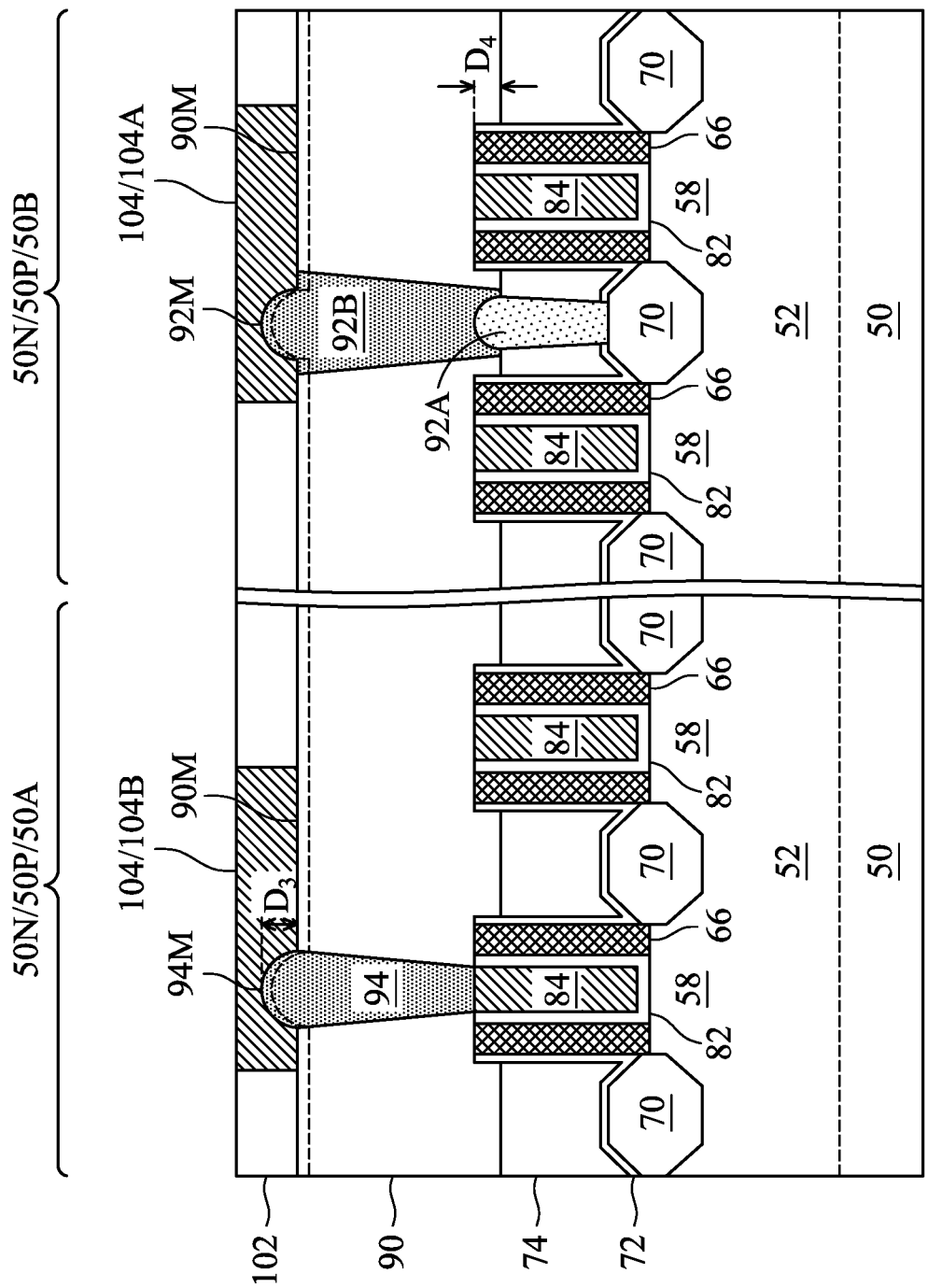
FIG. 15 is a cross-sectional view of FinFETs, in accordance with some other embodiments.

FIG. 15 is a cross-sectional view of FinFETs, in accordance with some other embodiments. This embodiment is similar to the embodiment described with respect to FIG. 14, except the lower source/drain contacts 92A have convex surfaces that contact the upper source/drain contacts 92B. The upper source/drain contacts 92B can be formed in such a manner by recessing the first ILD layer 74 before forming the second ILD layer 90, thus exposing convex surfaces of the lower source/drain contacts 92A. As an example to expose the sidewalls of the lower source/drain contacts 92A, the first ILD layer 74 can be recessed using a similar process as the process for recessing the second ILD layer 90 described with respect to FIG. 13 (e.g., by performing an etch process with a low etch selectivity between the dielectric material of the first ILD layer 74 and the conductive material of the lower source/drain contacts 92A), which can recess the first ILD layer 74 by a depth $D_4$ of at least about 2 nm, such as in the range of about 2 nm to about 15 nm. The depth $D_4$ can be from about 4% to about 25% of the original height of the first ILD layer 74.

Figure 16:
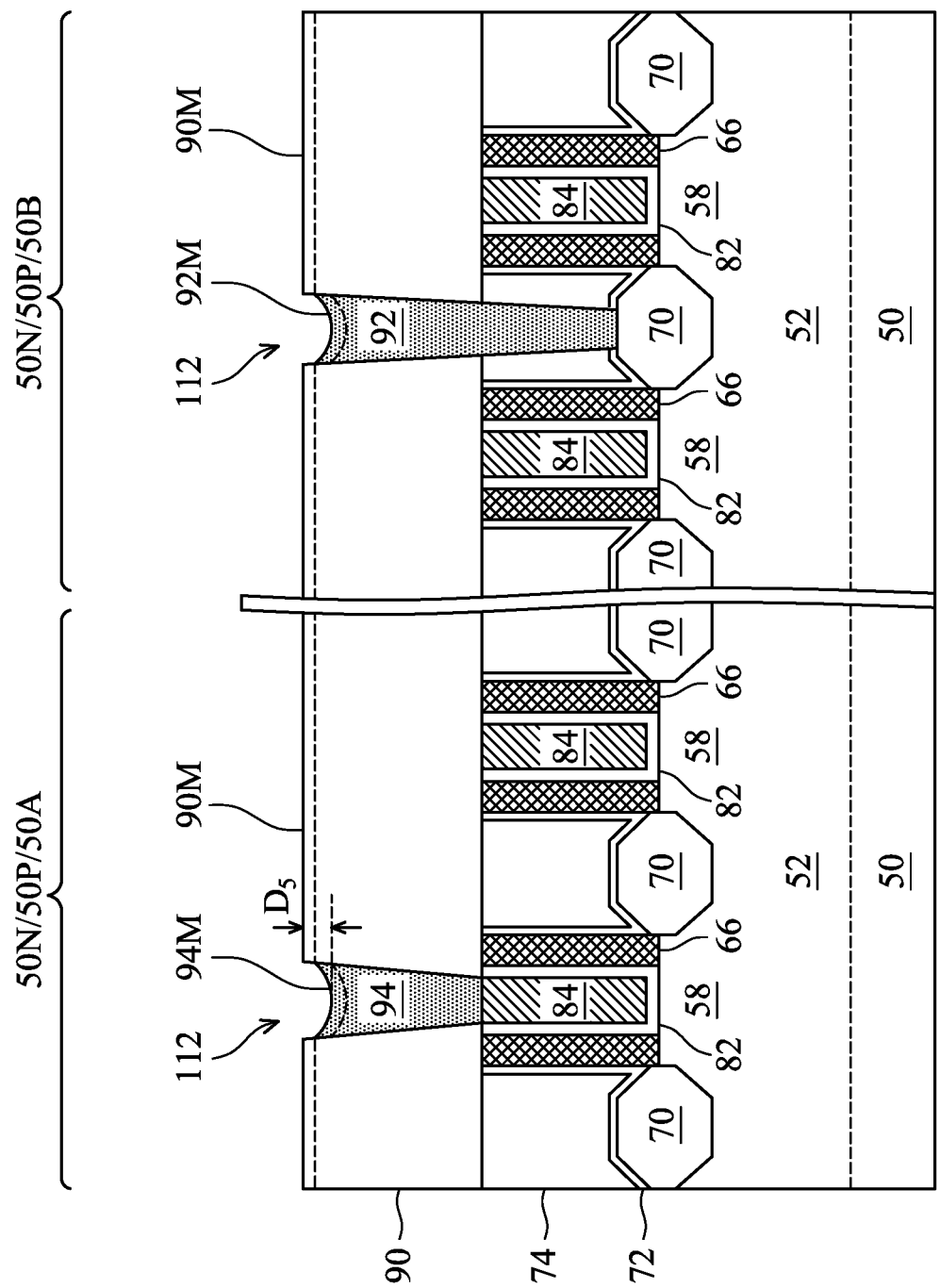
FIGS. 16 and 17 are cross-sectional views of intermediate stages in the manufacturing of FinFETs, in accordance with some other embodiments.
Figure 17:
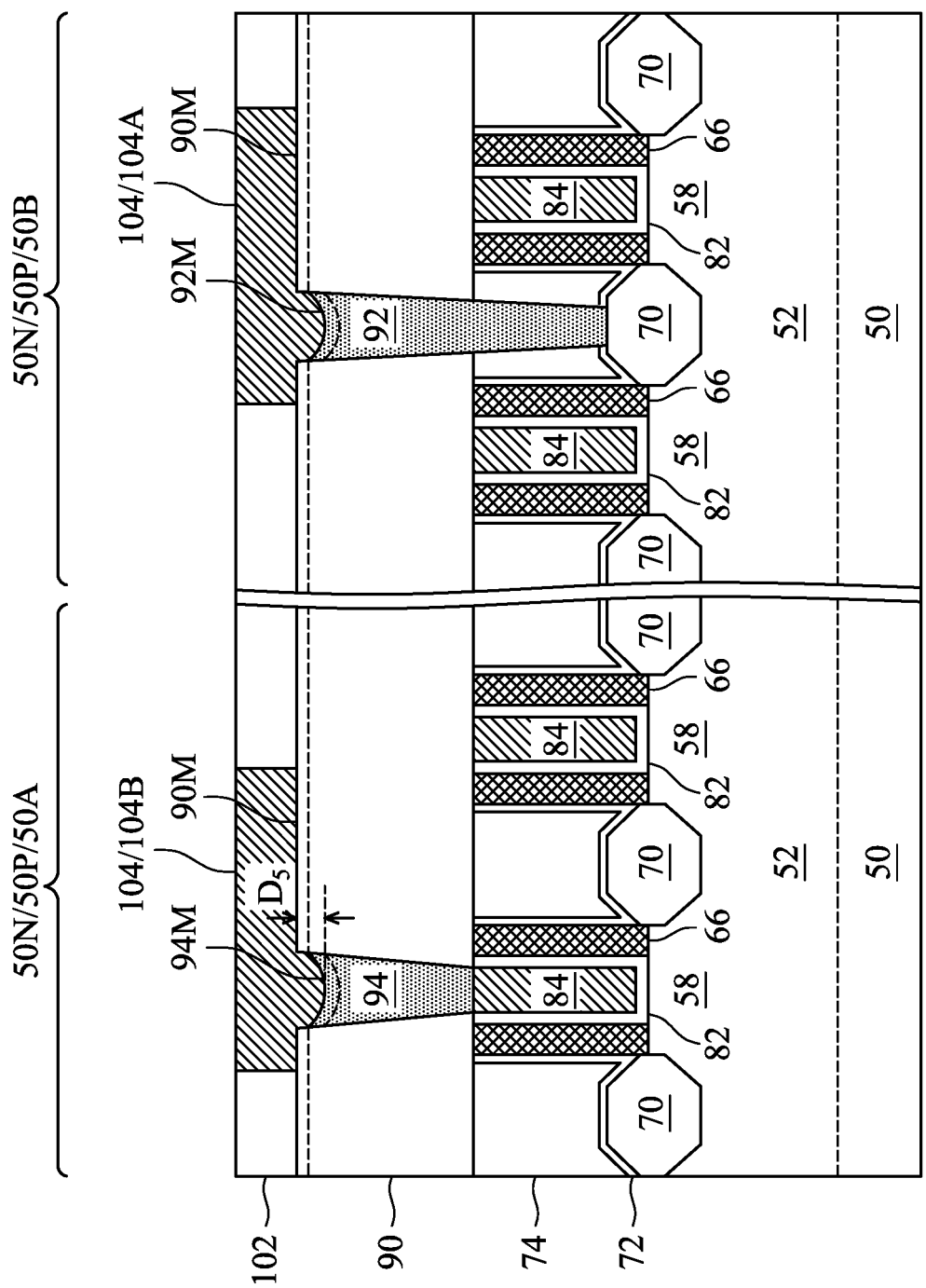

FIGS. 16 and 17 are cross-sectional views of intermediate stages in the manufacturing of FinFETs, in accordance with some other embodiments. FIGS. 16 and 17 are cross-sectional views illustrated along reference cross-section A-A in FIG. 1, except four gate structures are shown. FIGS. 16 and 17 also illustrate a first region 50A (in which a gate contact will be formed) and a second region 50B (in which a source/drain contact will be formed).

In FIG. 16, a structure similar to that described with respect to FIG. 8 is obtained. The source/drain contacts 92 and the gate contacts 94 are then recessed to form recesses 112. The recesses 112 expose portions of surfaces at the interface of the second ILD layer 90 and the contacts 92, 94, such as portions of the sidewalls of the second ILD layer 90. The recessing may be by an acceptable etch process, such as one that is selective to the conductive material of the contacts 92, 94. In embodiments where the contacts 92, 94 are formed of cobalt, a plasma etch may be performed using a fluorine or chlorine based etchant. An additional gas such as hydrogen or oxygen may be included with the etching gases to sublimate solid-phase etching byproducts. In other embodiments where the contacts 92, 94 are formed of cobalt, a wet chemical etch may be performed using a sulfuric peroxide mixture (SPM), a hydrochloric acid-hydrogen peroxide-water mixture (HPM), piranha solution, or the like. SPM is a mixture of sulfuric acid ($H_2SO_4$), hydrogen peroxide ($H_2O_2$), and deionized water (DIW). HPM is a mixture of hydrochloric acid (HCl), hydrogen peroxide ($H_2O_2$), and water ($H_2O$). Piranha solution is a mixture of sulfuric acid ($H_2SO_4$) and hydrogen peroxide ($H_2O_2$). As an example to form the recesses 112, the contacts 92, 94 can be etched by a wet etch using SPM for a duration in the range of about 3 seconds to about 10 seconds, which can form the recesses 112 to a depth $D_5$ of at least about 2 nm, such as in the range of about 2 nm to about 15 nm. The depth $D_5$ can be from about 4% to about 25% of the original height of the gate contacts 94. Such an etch process can result in a high etch selectivity between the dielectric material of the second ILD layer 90 and the conductive material of the contacts 92, 94. For example, such an etch process can selectively etch the dielectric material of the second ILD layer 90 up to about 10 times faster than the conductive material of the contacts 92, 94. After the recesses 112 are formed, the contacts 92, 94 have concave top surfaces. Recessing the contacts 92, 94 so that they have concave top surfaces increases the exposed surface area of the contacts 92, 94 by an amount in the range of about 100% to about 700%.

Optionally, one or more implants can be performed to modify an upper region 90M of the second ILD layer 90, exposed regions 92M of the source/drain contacts 92, and exposed regions 94M of the gate contacts 94. An anneal can be performed after the implanting to activate the impurities that were implanted. The implanting and annealing can be similar to those described with respect to FIG. 9.

In FIG. 17, a IMD layer 102 is formed on the second ILD layer 90. Conductive features 104 are formed in the IMD layer 102 and the recesses 112. The IMD layer 102 and conductive features 104 can be formed in a similar manner as those described with respect to FIG. 10.

The conductive features 104 contact the concave top surfaces of the contacts 92, 94. In other words, the conductive features 104A contact the concave top surfaces of the source/drain contacts 92, and the conductive features 104B contact the concave top surfaces of the gate contacts 94. As a result of recessing the contacts 92, 94, the conductive features 104A, 104B extend partially into the second ILD layer 90, the conductive features 104 extend through the IMD layer 102, and the conductive features 104 extend partially into the second ILD layer 90 by the distance D5. Further, the conductive features 104 extend into the contacts 92, 94. The conductive features 104 thus each physically contact the sidewalls of the second ILD layer 90 and the concave top surfaces of one of the contacts 92, 94. The surface area of the interfaces between the contacts 92, 94 and the conductive features 104 may thus be increased. For example, the surface area of each interface may be increased by an amount in the range of about 100% to about 700%. Increasing the surface area of the interfaces between the contacts 92, 94 and the conductive features 104 can help reduce the resistance of the contacts. Because the conductive features 104 extend through the IMD layer 102 and partially into the second ILD layer 90, the final height of the contacts 92, 94 is less than the final height of the second ILD layer 90. Specifically, the top surface of the second ILD layer 90 is disposed further from the substrate 50 than the top surfaces of the contacts 92, 94. Further, as noted above, forming the doped regions 92M, 94M can help reduce the work function difference between the contacts 92, 94 and the conductive features 104. Specifically, the work function of the material of the doped regions 92M, 94M is greater than the work function of the material of the contacts 92, 94 and is less than the work function of the material of the conductive features 104. Reducing the work function difference between the contacts 92, 94 and the conductive features 104 can help reduce the resistance of the contacts.

Figure 18:
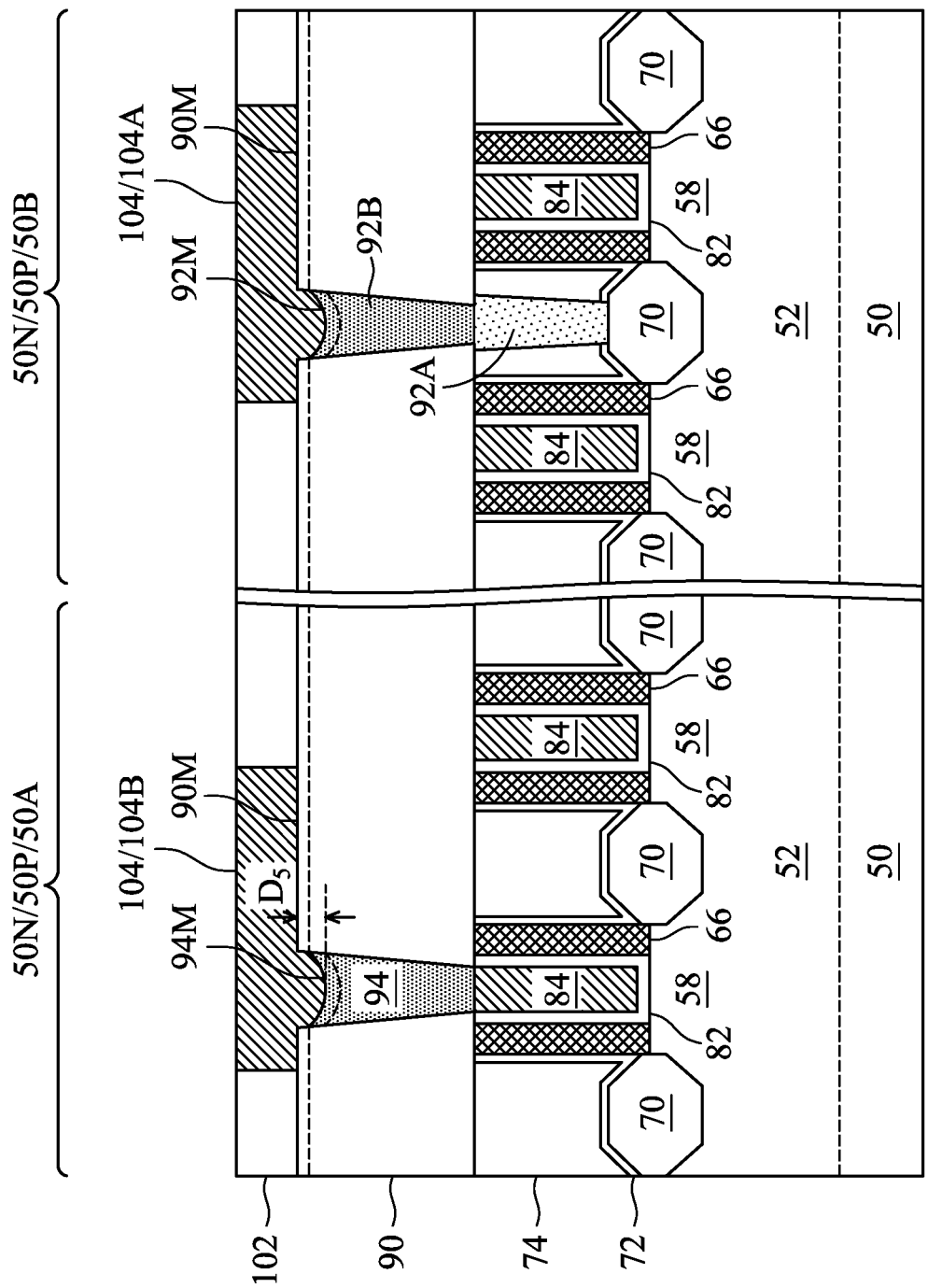
FIG. 18 is a cross-sectional view of FinFETs, in accordance with some other embodiments.

FIG. 18 is a cross-sectional view of FinFETs, in accordance with some other embodiments. This embodiment is similar to the embodiment described with respect to FIG. 17, except the source/drain contacts include lower source/drain contacts 92A and upper source/drain contacts 92B, similar to the embodiment described with respect to FIG. 11. The lower source/drain contacts 92A extend through the first ILD layer 74 and CESL 72, and the upper source/drain contacts 92B extend partially through the second ILD layer 90. The recesses 112 (see FIG. 16) are thus formed by etching the contacts 92B, 94.

It should be appreciated that some embodiments may combine features from the embodiments illustrated in FIGS. 17 and 18. For example, source/drain contacts in a first region of a die (e.g., an input/output region) can be continuous conductive features that extend through multiple ILD layers (as shown in FIG. 17), while source/drain contacts in a second region of the die (e.g., a core logic region) can have separate upper and lower conductive features in respective ILD layers (as shown in FIG. 18).

Figure 19:
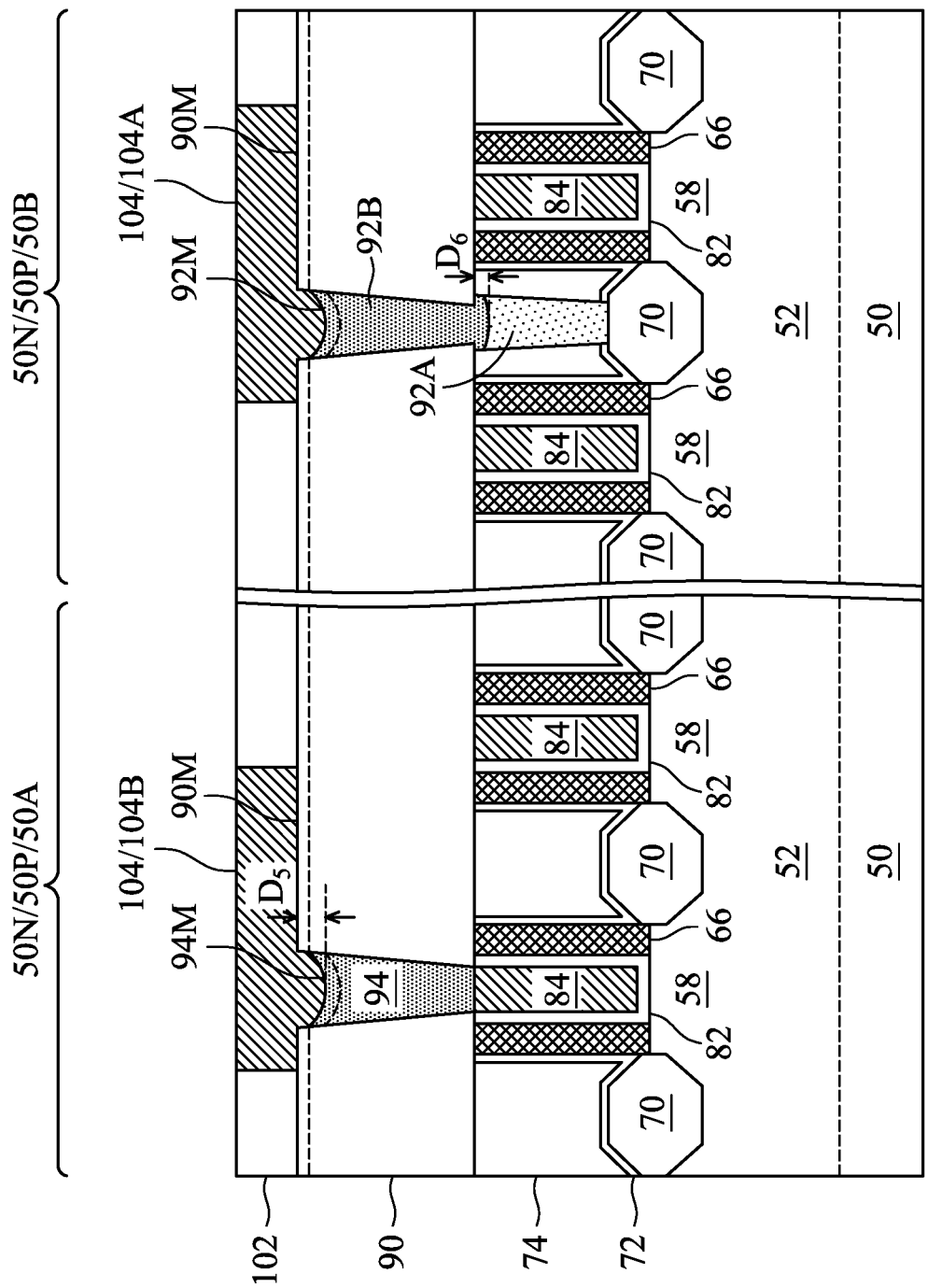
FIG. 19 is a cross-sectional view of FinFETs, in accordance with some other embodiments.

FIG. 19 is a cross-sectional view of FinFETs, in accordance with some other embodiments. This embodiment is similar to the embodiment described with respect to FIG. 18, except the upper source/drain contacts 92B extend partially into the first ILD layer 74 and the lower source/drain contacts 92A. The upper source/drain contacts 92B can be formed in such a manner by recessing the lower source/drain contacts 92A before forming the second ILD layer 90, thus forming concave top surfaces for the lower source/drain contacts 92A. As an example to form concave top surfaces for the lower source/drain contacts 92A, the lower source/drain contacts 92A can be recessed using a similar process as the process for recessing the upper source/drain contacts 92B described with respect to FIG. 16, which can recess the lower source/drain contacts 92A by a depth D6 of at least about 2 nm, such as in the range of about 2 nm to about 15 nm. The depth D6 can be from about 4% to about 25% of the original height of the lower source/drain contacts 92A.

Some variations of the embodiments are possible. For example, in the embodiment described with respect to FIG. 18, the first ILD layer 74 can be recessed before forming the upper source/drain contacts 92B, in a similar manner as the embodiments described with respect to FIGS. 12 and 15, so that the lower source/drain contacts 92A extend into the upper source/drain contacts 92B. Likewise, in the embodiments described with respect to FIGS. 11 and 14, the lower source/drain contacts 92A can be recessed before forming the upper source/drain contacts 92B, in a similar manner as the embodiment described with respect to FIG. 19, so that the upper source/drain contacts 92B extend into the lower source/drain contacts 92A.

Embodiments may achieve advantages. Recessing the second ILD layer 90 or the contacts 92, 94 allows the contacts 92, 94 to have exposed sidewalls, convex top surfaces, or concave top surfaces. Forming the contacts 92, 94 with exposed sidewalls, convex top surfaces, or concave top surfaces can help increase the surface area of the interfaces between the contacts 92, 94 and the conductive features 104. Increasing the surface area of the interfaces between the contacts 92, 94 and the conductive features 104 can help reduce the resistance of the contacts, improving the performance of the FinFETs. Further, doping the upper regions of the contacts 92, 94 can reduce the work function difference between the contacts 92, 94 and the conductive features 104, particularly when the contacts 92, 94 and the conductive features 104 are formed of different conductive materials. Reducing the work function difference between the contacts 92, 94 and the conductive features 104 can help reduce the resistance of the contacts, improving the performance of the FinFETs.

In an embodiment, a structure includes: a gate stack over a channel region of a substrate; a source/drain region adjacent the channel region; a first ILD layer over the source/drain region and the gate stack; a first IMD layer over the first ILD layer; a first conductive feature extending through the first IMD layer; a second conductive feature extending through the first IMD layer; a source/drain contact extending through the first ILD layer and partially into the first conductive feature, the source/drain contact physically contacting the source/drain region and the first conductive feature; and a gate contact extending through the first ILD layer and partially into the second conductive feature, the gate contact physically contacting the gate stack and the second conductive feature. In some embodiments of the structure, the source/drain contact has a first convex top surface physically contacting the first conductive feature, and the gate contact has a second convex top surface physically contacting the second conductive feature. In some embodiments of the structure, the source/drain contact has first sidewalls and a first flat top surface each physically contacting the first conductive feature, and the gate contact has second sidewalls and a second flat top surface each physically contacting the second conductive feature. In some embodiments, the structure further includes: a second ILD layer between the source/drain region and the first ILD layer, where the source/drain contact is a continuous conductive feature extending through the first ILD layer, through the second ILD layer, and partially into the first conductive feature. In some embodiments, the structure further includes: a second ILD layer between the source/drain region and the first ILD layer, where the source/drain contact includes: a third conductive feature extending through the first ILD layer and partially into the first conductive feature; and a fourth conductive feature between the third conductive feature and the source/drain region, the fourth conductive feature extending through the second ILD layer. In some embodiments, the structure further includes: a second ILD layer between the source/drain region and the first ILD layer, where the source/drain contact includes: a third conductive feature extending through the first ILD layer and partially into the first conductive feature; and a fourth conductive feature between the third conductive feature and the source/drain region, the fourth conductive feature extending through the second ILD layer and partially into the third conductive feature. In some embodiments of the structure, the source/drain contact and the gate contact each include a first conductive material, the first conductive feature and the second conductive feature each include a second conductive material, and the first conductive material is different from the second conductive material. In some embodiments of the structure, the first conductive material has a greater work function than the second conductive material.

In an embodiment, a structure includes: a gate stack over a channel region of a substrate; a source/drain region adjacent the channel region; a first ILD layer over the source/drain region and the gate stack; a first IMD layer over the first ILD layer; a first conductive feature extending through the first IMD layer and partially into the first ILD layer; a second conductive feature extending through the first IMD layer and partially into the first ILD layer; a source/drain contact extending partially into the first ILD layer, the source/drain contact physically contacting the source/drain region and the first conductive feature; and a gate contact extending partially into the first ILD layer, the gate contact physically contacting the gate stack and the second conductive feature. In some embodiments of the structure, the source/drain contact has a first concave top surface physically contacting the first conductive feature, and the gate contact has a second concave top surface physically contacting the second conductive feature. In some embodiments, the structure further includes: a second ILD layer between the source/drain region and the first ILD layer, where the source/drain contact is a continuous conductive feature extending partially into the first ILD layer and through the second ILD layer. In some embodiments, the structure further includes: a second ILD layer between the source/drain region and the first ILD layer, where the source/drain contact includes: a third conductive feature extending partially into the first ILD layer; and a fourth conductive feature between the third conductive feature and the source/drain region, the fourth conductive feature extending through the second ILD layer. In some embodiments, the structure further includes: a second ILD layer between the source/drain region and the first ILD layer, where the source/drain contact includes: a third conductive feature extending partially into the first ILD layer and partially into the second ILD layer; and a fourth conductive feature between the third conductive feature and the source/drain region, the fourth conductive feature extending partially into the second ILD layer. In some embodiments of the structure, the source/drain contact and the gate contact each include a first conductive material, the first conductive feature and the second conductive feature each include a second conductive material, and the first conductive material is different from the second conductive material. In some embodiments of the structure, the first conductive material has a greater work function than the second conductive material.

In an embodiment, a method includes: forming a gate stack over a channel region of a substrate; growing a source/drain region adjacent the channel region; depositing a first inter-layer dielectric (ILD) layer over the source/drain region and the gate stack; forming a source/drain contact through the first ILD layer, the source/drain contact physically contacting the source/drain region; forming a gate contact through the first ILD layer, the gate contact physically contacting the gate stack; recessing the first ILD layer to expose a first sidewall of the source/drain contact and a second sidewall of the gate contact; forming a first conductive feature physically contacting the first sidewall and a first top surface of the source/drain contact; and forming a second conductive feature physically contacting the second sidewall and a second top surface of the gate contact.

In some embodiments of the method, recessing the first ILD layer increases an exposed surface area of the source/drain contact and an exposed surface area of the gate contact by an amount in a range of 100% to 700%. In some embodiments, the method further includes: depositing a second ILD layer over the source/drain region, the first ILD layer being deposited on the second ILD layer, where forming the source/drain contact includes: forming a lower source/drain contact in the second ILD layer; recessing the second ILD layer; and forming an upper source/drain contact in the first ILD layer. In some embodiments, the method further includes: depositing a second ILD layer over the source/drain region, the first ILD layer being deposited on the second ILD layer, where forming the source/drain contact includes: forming a lower source/drain contact in the second ILD layer; recessing the lower source/drain contact; and forming an upper source/drain contact in the first ILD layer. In some embodiments, the method further includes: depositing a second ILD layer over the source/drain region, the first ILD layer being deposited on the second ILD layer, where forming the source/drain contact includes: forming a continuous conductive feature through the first ILD layer and the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first inter-layer dielectric (ILD) layer over a source/drain region, the source/drain region adjacent a channel region of a substrate;
   forming a gate stack over the channel region of the substrate, top surfaces of the gate stack and the first ILD layer being coplanar;
   depositing a second ILD layer over the gate stack and the first ILD layer;
   forming a source/drain contact through the second ILD layer, the source/drain contact physically contacting the source/drain region;
   forming a gate contact through the second ILD layer, the gate contact physically contacting the gate stack;
   recessing the second ILD layer to expose a first sidewall of the source/drain contact and a second sidewall of the gate contact;
   forming a first conductive feature physically contacting the first sidewall and a first top surface of the source/drain contact; and
   forming a second conductive feature physically contacting the second sidewall and a second top surface of the gate contact.

2. The method of claim 1, wherein recessing the second ILD layer increases an exposed surface area of the source/drain contact and an exposed surface area of the gate contact by an amount in a range of 100% to 700%.

3. The method of claim 1, wherein forming the source/drain contact comprises:
   forming a lower source/drain contact in the first ILD layer;
   recessing the first ILD layer; and
   forming an upper source/drain contact in the second ILD layer.

4. The method of claim 1, wherein forming the source/drain contact comprises:
   forming a lower source/drain contact in the first ILD layer;
   recessing the lower source/drain contact; and
   forming an upper source/drain contact in the second ILD layer.

5. The method of claim 1, wherein forming the source/drain contact comprises:
   forming a continuous conductive feature through the first ILD layer and the second ILD layer.

6. The method of claim 1, wherein the source/drain contact and the gate contact are formed of a first conductive material, the first conductive feature and the second conductive feature are formed of a second conductive material, and the first conductive material is different from the second conductive material.

7. The method of claim 6, wherein the first conductive material has a greater work function than the second conductive material.

8. The method of claim 6 further comprising:
   implanting an impurity in the first sidewall and the first top surface of the source/drain contact, and in the second sidewall and the second top surface of the gate contact.

9. A method comprising:
   forming a gate stack over a channel region of a substrate;
   growing a source/drain region adjacent the channel region;
   depositing a first inter-layer dielectric (ILD) layer over the source/drain region and the gate stack;
   forming a source/drain contact through the first ILD layer, the source/drain contact physically contacting the source/drain region;
   forming a gate contact through the first ILD layer, the gate contact physically contacting the gate stack;
   recessing the gate contact and the source/drain contact such that a first top surface of the source/drain contact and a second top surface of the gate contact are beneath a top surface of the first ILD layer, wherein recessing the gate contact and the source/drain contact exposes a first sidewall of the first ILD layer and a second sidewall of the first ILD layer;
   forming a first conductive feature physically contacting the first sidewall of the first ILD layer and the first top surface of the source/drain contact; and
   forming a second conductive feature physically contacting the second sidewall of the first ILD layer and the second top surface of the gate contact.

10. The method of claim 9, wherein the first top surface of the source/drain contact is convex, and the second top surface of the gate contact is convex.

11. The method of claim 9 further comprising:
    depositing a second ILD layer over the source/drain region, the first ILD layer being deposited on the second ILD layer,
    wherein forming the source/drain contact comprises:
      forming a lower source/drain contact in the second ILD layer;
      recessing the second ILD layer; and
      forming an upper source/drain contact in the first ILD layer.

12. The method of claim 9 further comprising:
depositing a second ILD layer over the source/drain region, the first ILD layer being deposited on the second ILD layer,
wherein forming the source/drain contact comprises:
  forming a lower source/drain contact in the second ILD layer;
  recessing the lower source/drain contact; and
  forming an upper source/drain contact in the first ILD layer.

13. The method of claim 9 further comprising:
depositing a second ILD layer over the source/drain region, the first ILD layer being deposited on the second ILD layer,
wherein forming the source/drain contact comprises:
  forming a continuous conductive feature through the first ILD layer and the second ILD layer.

14. The method of claim 9, wherein the source/drain contact and the gate contact are formed of a first conductive material, the first conductive feature and the second conductive feature are formed of a second conductive material, and the first conductive material is different from the second conductive material.

15. The method of claim 14, wherein the first conductive material has a greater work function than the second conductive material.

16. The method of claim 14 further comprising:
implanting an impurity in the first top surface of the source/drain contact, and in the second top surface of the gate contact.

17. A method comprising:
growing a source/drain region adjacent a channel region of a substrate;
depositing a first inter-layer dielectric (ILD) layer over the source/drain region;
forming a source/drain contact through the first ILD layer, the source/drain contact physically contacting the source/drain region;
recessing the first ILD layer to expose a surface of the source/drain contact;
implanting an impurity in an upper region of the first ILD layer and an upper region of the source/drain contact, a lower region of the first ILD layer and a lower region of the source/drain contact remaining undoped, the upper region of the source/drain contact extending between sidewalls of the first ILD layer, the lower region of the source/drain contact extending between the sidewalls of the first ILD layer; and
forming a first conductive feature physically contacting the surface of the source/drain contact exposed by the recessing of the first ILD layer.

18. The method of claim 17, wherein the surface of the source/drain contact is a sidewall of the source/drain contact.

19. The method of claim 17, wherein the surface of the source/drain contact is a convex top surface of the source/drain contact.

20. The method of claim 17, wherein the impurity is implanted after recessing the first ILD layer.

* * * * *